(12) United States Patent
Tamura

(10) Patent No.: US 7,126,400 B2
(45) Date of Patent: Oct. 24, 2006

(54) DELAY ADJUSTMENT CIRCUIT, INTEGRATED CIRCUIT DEVICE, AND DELAY ADJUSTMENT METHOD

(75) Inventor: Tsuyoshi Tamura, Suwagun Harahura (JP)

(73) Assignee: Seiko Epson Corporation, Tokyo (JP)

( * ) Notice: Subject to any disclaimer, the term of this patent is extended or adjusted under 35 U.S.C. 154(b) by 27 days.

(21) Appl. No.: 11/013,472

(22) Filed: Dec. 17, 2004

(65) Prior Publication Data

US 2005/0134351 A1 Jun. 23, 2005

(30) Foreign Application Priority Data

Dec. 17, 2003 (JP) ............................. 2003-419236

(51) Int. Cl.
*H03H 11/26* (2006.01)
(52) U.S. Cl. ....................................... 327/261; 327/149
(58) Field of Classification Search ................ 327/261, 327/264, 276, 149, 153, 158, 161; 331/17, 331/25, DIG. 2; 375/375, 376; 324/527
See application file for complete search history.

(56) References Cited

U.S. PATENT DOCUMENTS 6,587,811 B1 * 7/2003 Schleifer et al. ............ 702/176

FOREIGN PATENT DOCUMENTS

| JP | A 04-105413  | 4/1992  |
|----|--------------|---------|
| JP | A 05-275988  | 10/1993 |
| JP | A 06-164339  | 6/1994  |
| JP | A 7-130183   | 5/1995  |
| JP | A 2000-201058| 7/2000  |
| JP | A 2000-216338| 8/2000  |
| JP | A 2001-250920| 9/2001  |
| JP | A 2001-257568| 9/2001  |
| JP | A 2002-135234| 5/2002  |
| JP | A-2002-334434| 11/2002 |
| JP | A 2003-069397| 3/2003  |

* cited by examiner

*Primary Examiner*—Linh My Nguyen
(74) *Attorney, Agent, or Firm*—Oliff & Berridge, PLC

(57) ABSTRACT

A delay circuit includes a plurality of delay units DI to DN. An input signal IS is input to the delay circuit, and the delay circuit outputs a delay signal. A comparison circuit stores, to a comparison result register, comparison result data of a pulse width time of a pulse of a test input signal IS input to the delay circuit and delay times of delay signals DSM to DSN output from taps PM to PN of the delay circuit. An adjustment circuit adjusts the delay time of the delay signal in the delay circuit. Adjustment data ADT of the delay time is set based on the comparison result data read from the comparison result register. The delay time after adjustment is confirmed by again inputting the test input signal after the delay time has been adjusted, and again reading the comparison result data from the comparison result register.

17 Claims, 16 Drawing Sheets

DELAY ADJUSTMENT CIRCUIT, INTEGRATED CIRCUIT DEVICE, AND DELAY ADJUSTMENT METHOD

Japanese Patent Application No. 2003-419236, filed on Dec. 17, 2003, is hereby incorporated by reference in its entirety.

BACKGROUND OF THE INVENTION

The present invention relates to a delay adjustment circuit, an integrated circuit device, and a delay adjustment method.

A delay circuit may be used in an integrated circuit device (IC) in order to adjust the signal AC characteristics such as holding time within the allowable range specified in the specification. However, the delay time of the signal in the delay circuit varies depending on changes in the manufacturing lot, operating voltage, and temperature condition of the IC which includes the delay circuit. Therefore, when setting the signal AC characteristics using such a delay circuit, a value taking the variation into consideration must be provided in the item of the AC characteristics in the IC specification.

BRIEF SUMMARY OF THE INVENTION

A delay adjustment circuit according to one aspect of the present invention includes:

a delay circuit to which an input signal is input, the delay circuit including a plurality of delay units and outputting a delay signal of the input signal;

a comparison circuit which stores, to a comparison result register, comparison result data of a pulse width time of a pulse of a test input signal and M-th to N-th (M and N are integers provided that N>M) delay times of M-th to N-th delay signals, the test input signal being input to the delay circuit and the M-th to N-th delay signals being respectively output from M-th to N-th taps among a plurality of taps provided between the delay units of the delay circuit; and an adjustment circuit which adjusts delay time of the delay signal of the input signal in the delay circuit.

An integrated circuit device according to another aspect of the present invention includes:

a first I/O cell to which an input signal is input;

a second I/O cell from which an output signal is output;

the above delay adjustment circuit to which the input signal is input through the first I/O cell and which outputs the delay signal of the input signal, delay time of which has been adjusted; and an output control signal generation circuit which generates an output control signal of the output signal output through the second I/O cell based on the delay signal from the delay adjustment circuit.

A further aspect of the present invention relates to a delay time adjustment method using the above delay adjustment circuit and includes:

inputting the test input signal having a pulse with a predetermined pulse width time to the delay circuit;

reading the comparison result data of the pulse width time of the test input signal and the M-th to N-th delay times from the comparison result register; and setting adjustment data for adjusting the delay time of the delay signal based on the read comparison result data.

DETAILED DESCRIPTION OF THE EMBODIMENT

Figure 1:
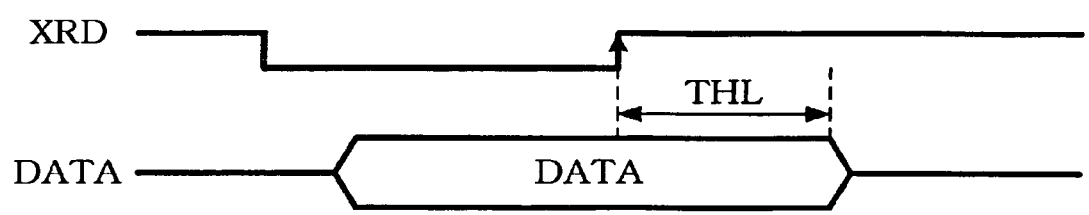
FIG. 1 is illustrative of a specification of AC characteristics.

An embodiment of the present invention has been achieved in view of the above-described problem and may provide a delay adjustment circuit which can optimally adjust the delay time of a delay signal, an integrated circuit device including the delay adjustment circuit, and a delay adjustment method using the delay adjustment circuit.

A delay adjustment circuit according to an embodiment of the present invention includes:

a delay circuit to which an input signal is input, the delay circuit including a plurality of delay units and outputting a delay signal of the input signal;

a comparison circuit which stores, to a comparison result register, comparison result data of a pulse width time of a pulse of a test input signal and M-th to N-th (M and N are integers provided that N>M) delay times of M-th to N-th delay signals, the test input signal being input to the delay circuit and the M-th to N-th delay signals being respectively output from M-th to N-th taps among a plurality of taps provided between the delay units of the delay circuit; and an adjustment circuit which adjusts delay time of the delay signal of the input signal in the delay circuit.

The pulse width time of the test input signal is compared with the M-th to N-th delay times of the M-th to N-th delay signals of the delay circuit, and the comparison result is stored in the comparison result register. The delay time in the delay circuit is adjusted by the adjustment circuit. Therefore, optimum adjustment of the delay time can be realized by allowing a tester or the like to read the comparison result data from the comparison result register and to set the degree of adjustment of the delay time by the adjustment circuit based on the read comparison result data.

With this delay adjustment circuit, the comparison circuit may include first to (N−M+1)th logic circuits and the comparison result register which includes first to (N−M+1)th flip-flop circuits, and the test input signal may be input to a first input of each of the first to (N−M+1)th logic circuits, the M-th to N-th delay signals may be respectively input to second inputs of the first to (N−M+1)th logic circuits, and outputs from the first to (N−M+1)th logic circuits may be respectively input to clock terminals of the first to (N−M+1)th flip-flop circuits.

With this delay adjustment circuit, the comparison circuit may include the comparison result register which includes first to (N−M+1)th flip-flop circuits, and the M-th to N-th delay signals may be respectively input to data terminals of the first to (N−M+1)th flip-flop circuits, and the test input signal may be input to a clock terminal of each of the first to (N−M+1)th flip-flop circuits.

This enables the comparison result data of the pulse width time of the test input signal and the M-th to N-th delay times to be automatically fetch to the first to (N−M+1)th flip-flop circuits.

With this delay adjustment circuit, the adjustment circuit may include a first select circuit for delay time adjustment to which K-th to L-th (K and L are integers provided that L>K) delay signals are input and which selects and outputs one of the K-th to L-th delay signals, the K-th to L-th delay signals being respectively output from K-th to L-th taps among the plurality of taps of the delay circuit, and the output from the first select circuit may be input to an (L+1)th delay unit among the plurality of the delay units, an (L+1)th tap among the plurality of taps of the delay circuit being provided to an output of the (L+1)th delay unit.

This enables one of the K-th to L-th delay signals output from the K-th to L-th taps to be bypassed and input to the (L+1)th delay unit, whereby the adjustment of the delay time in the delay circuit can be realized.

With this delay adjustment circuit, the adjustment circuit may include a second select circuit for typical value setting to which I-th to J-th (I and J are integers provided that J>I) delay signals are input and which selects and outputs one of the I-th to J-th delay signals, the I-th to J-th delay signals being respectively output from I-th to J-th taps among the plurality of taps of the delay circuit, and the output from the second select circuit may be input to a (J+1)th delay unit among the plurality of the delay units, a (J+1)th tap among the plurality of taps of the delay circuit being provided to an output of the (J+1)th delay unit.

This enables one of the I-th to J-th delay signals output from the I-th to J-th taps to be bypassed and input to the (J+1)th delay unit, whereby the adjustment of the delay time in the delay circuit can be realized.

This delay adjustment circuit may includes a constant voltage generation circuit which generates a constant voltage, and the delay circuit may operate using the constant voltage generated by the constant voltage generation circuit as a power supply voltage.

This enables the delay time in the delay circuit to be independent from variation of the power supply voltage, whereby the variation factors of the delay time can be reduced.

This delay adjustment circuit may include an initial state setting circuit which outputs adjustment data for adjusting the delay time of the delay signal of the input signal, and the adjustment circuit may adjust the delay time of the delay signal of the input signal based on the adjustment data output from the initial state setting circuit.

This enables the delay time in the delay circuit to be adjusted based on the adjustment data set as the initial state.

With this delay adjustment circuit, the initial state setting circuit may include:

a latch circuit which fetches and stores a setting state of a fuse element or a nonvolatile memory element as the adjustment data; and a latch clock generation circuit which generates a latch clock signal for allowing the latch circuit to fetch the setting state of the fuse element or the nonvolatile memory element, the latch clock generation circuit may generate the latch clock signal and may output the latch clock signal to the latch circuit before the input signal is input to the delay circuit, and the latch circuit may fetch the setting state of the fuse element or the nonvolatile memory element based on the generated latch clock signal before the input signal is input to the delay circuit.

This enables the setting state of the fuse element or the nonvolatile memory to be fetched to the latch circuit only before the input signal is input to the delay circuit, whereby power consumption can be reduced.

An integrated circuit device according another embodiment of the present invention includes:

a first I/O cell to which an input signal is input;

a second I/O cell from which an output signal is output;

the above delay adjustment circuit to which the input signal is input through the first I/O cell and which outputs the delay signal of the input signal, delay time of which has been adjusted; and an output control signal generation circuit which generates an output control signal of the output signal output through the second I/O cell based on the delay signal from the delay adjustment circuit.

According to this embodiment, the output control signal of the output signal output through the second I/O cell is generated based on the delay signal, delay time of which is optimally adjusted by the delay adjustment circuit. This makes it possible to satisfy a strict demand for the specification of the AC characteristics of the output signal output through the second I/O cell.

With this integrated circuit device, the output control signal generation circuit may generate an output enable signal of the second I/O cell based on the delay signal from the delay adjustment circuit.

A further embodiment of the present invention provides a delay time adjustment method using the above delay adjustment circuit and includes:

inputting the test input signal having a pulse with a predetermined pulse width time to the delay circuit;

reading the comparison result data of the pulse width time of the test input signal and the M-th to N-th delay times from the comparison result register; and setting adjustment data for adjusting the delay time of the delay signal based on the read comparison result data.

According to this embodiment, the adjustment data is set based on the comparison result data of the pulse width time of the test input signal and the M-th to N-th delay times, and the adjustment circuit adjusts the delay time based on the adjustment data. This realizes optimum adjustment of the delay time.

This delay time adjustment method may include:

inputting again the test input signal having a pulse with the predetermined pulse width time to the delay circuit after the delay time has been adjusted by setting the adjustment data; and confirming the delay time after adjustment by reading the comparison result data of the pulse width time of the test input signal input again and the M-th to N-th delay times from the comparison result register.

This enables secure and easy confirmation of whether or not the delay adjustment is suitably performed.

Embodiments of the present invention are described in detail below with reference to the drawings. Note that the embodiments described hereunder do not in any way limit the scope of the invention defined by the claims laid out herein. Note also that not all of the elements of these embodiments should be taken as essential requirements to the means of the present invention.

1. Adjustment of AC Characteristics

A specification of an integrated circuit device (IC) includes an item which specifies signal AC characteristics. In FIG. 1, XRD ("X" means a negative logic) stands for a read signal and DATA stands for data which is read by causing the read signal XRD to become active (L level in FIG. 1), for example. Specifically, an external device (CPU or the like) of the integrated circuit device (liquid crystal driver or the like) causes the read signal XRD to become active as shown in FIG. 1 when reading the data DATA from the integrated circuit device. The integrated circuit device outputs the data DATA from an I/O cell after the read signal XRD has become active. The external device latches the data DATA in synchronization with the rising edge of the read signal XRD, for example. In this case, if a holding time THL of the data DATA is too short, the external device fails to latch the data DATA. Therefore, the item of the holding time THL is described in the specification as the signal AC characteristics.

Suppose that a typical value, a minimum value, and a maximum value of the holding time THL, required by the user of the integrated circuit device as a specification, are respectively 60 ns, 40 ns, and 80 ns ("ns" stands for nanosecond), for example. In order to satisfy this specification, a delay circuit including a plurality of delay units (delay elements) is provided, and the holding time THL with a typical value of 60 ns is set using a delay signal generated by the delay circuit. In this case, the delay time of the signal in the delay circuit varies depending on the manufacturing lot, power supply voltage, and temperature condition of the IC. When the coefficients of variation due to the manufacturing lot, power supply voltage, and temperature condition of the IC are respectively 0.72 to 1.32, 0.85 to 1.15, and 0.95 to 1.07, for example, the total coefficient of variation is 0.6 to 1.6. Therefore, when the typical value is 60 ns, the holding time THL varies in the range of 36 to 96 ns, whereby the above-mentioned specification (40 to 80 ns) cannot be satisfied. Therefore, a delay adjustment circuit which can optimally adjust the delay time is necessary in order to satisfy such a specification.

2. Configuration of Delay Adjustment Circuit

Figure 2:
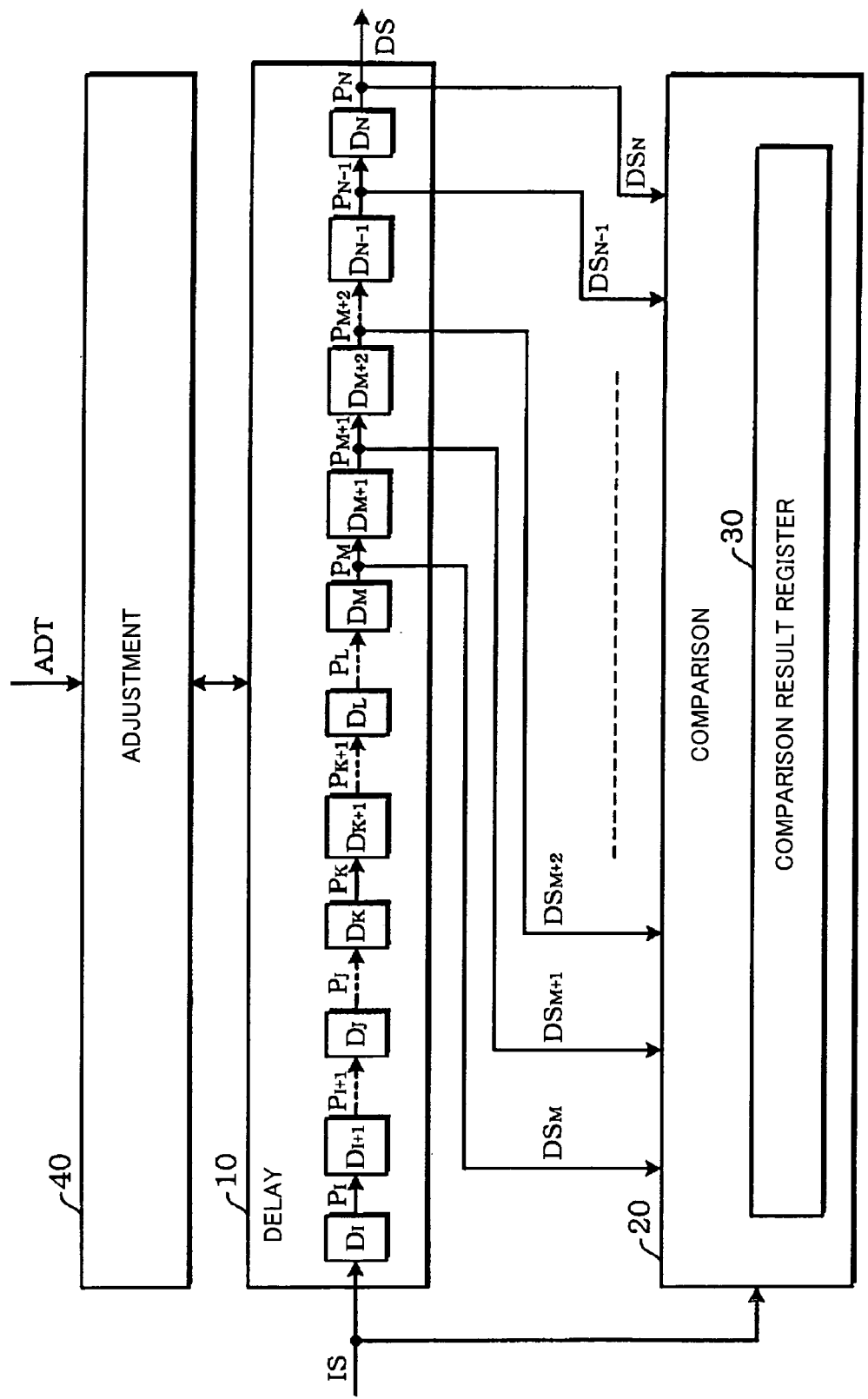
FIG. 2 is a configuration example of a delay adjustment circuit in an embodiment of the present invention.

FIG. 2 shows a configuration example of the delay adjustment circuit (delay measurement circuit or delay self-diagnostic circuit) in this embodiment. The delay adjustment circuit in this embodiment includes a delay circuit 10, a comparison circuit 20, and an adjustment circuit 40. The delay adjustment circuit in this embodiment is not limited to the configuration shown in FIG. 2. Some of the circuit blocks may be omitted, or the connection configuration of the circuit blocks may be changed, or the configuration or function of each circuit block may be changed. For example, this embodiment may be configured as a delay measurement circuit in which the adjustment circuit 40 shown in FIG. 2 is omitted. Or, this embodiment may be configured so that the delay circuit 10 and the comparison circuit 20 are connected in a different form from that shown in FIG. 2.

The delay circuit 10 includes a plurality of delay units DI to DJ, DK to DL, and DM to DN. I, J, K, L, M, and N are integers that satisfy J>I, L>K, and N>M. Each delay unit of the delay circuit 10 is formed by a delay element such as an inverter circuit (buffer circuit). An input signal IS is input to the delay circuit 10, and the delay circuit 10 outputs a delay signal DS obtained by delaying the input signal IS using the delay units DI to DN. M-th to N-th delay signals DSM to DSN are respectively output from M-th to N-th taps PM to PN, each of which is provided between the delay units of the delay circuit 10. In FIG. 2, the delay circuit 10 includes only one delay path (path formed by the delay units connected in series). However, the delay circuit 10 may include a plurality of delay paths. The delay signals DSM to DSN may be output from the taps PM to PN provided in these delay paths.

Figure 3:
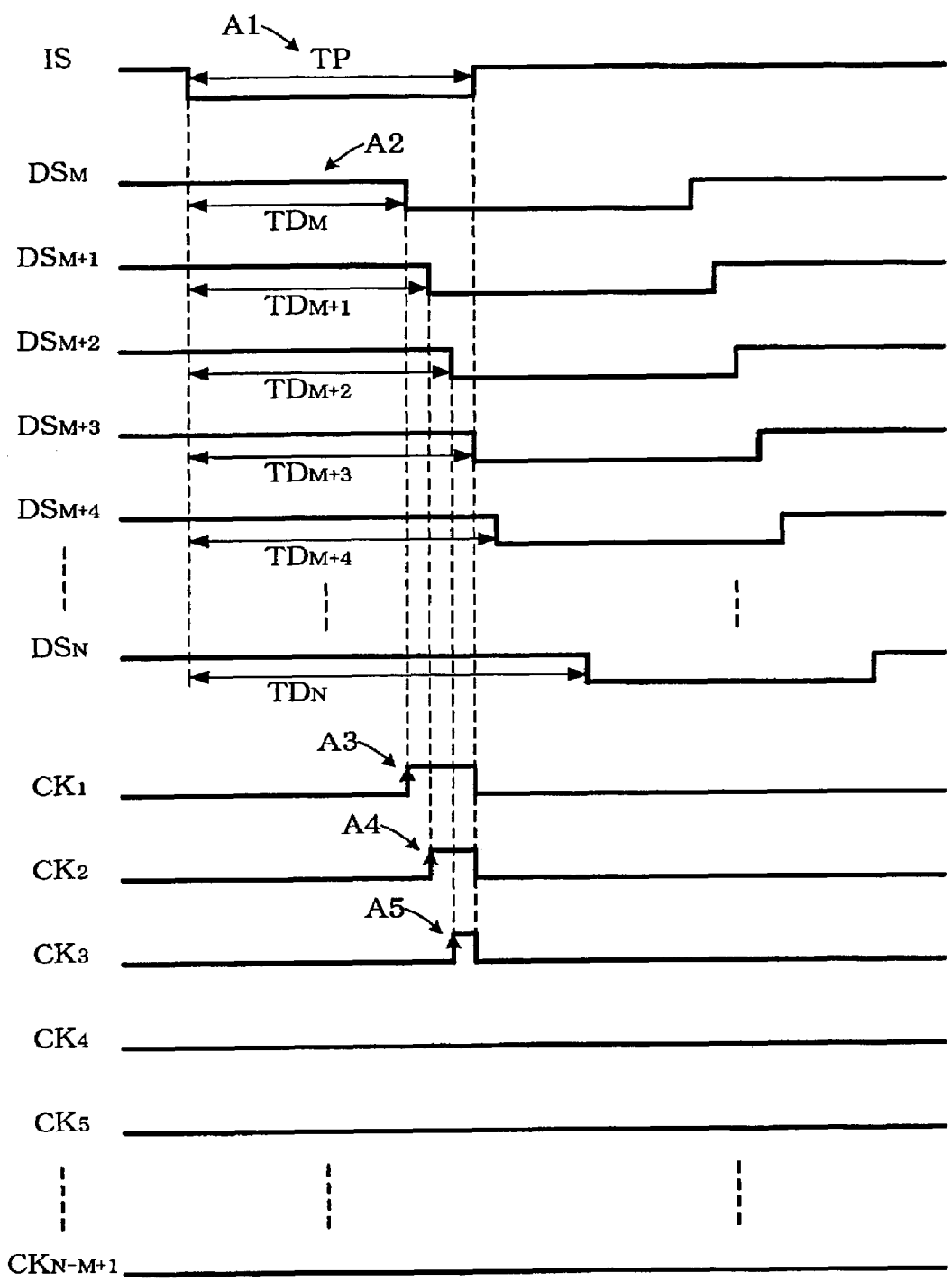
FIG. 3 is a timing waveform example for describing an operation in this embodiment.

As indicated by A1 in FIG. 3, a test input signal having a pulse with a predetermined pulse width time TP (50 ns, for example) is input as the input signal IS. As indicated by A2, the delay signals DSM to DSN, which are delayed from the input signal IS respectively for M-th to N-th delay times TDM to TDN, are output from the taps PM to PN of the delay circuit 10, respectively. Specifically, the delay signals DSM to DSN respectively change from a high level (first level in a broad sense) to a low level (second level in a broad sense) after the delay times TDM to TDN from the falling edge (first edge in a broad sense) of the input signal IS. The delay signals DSM to DSN change from the low level to the high level respectively after the delay times TDM to TDN from the rising edge (second edge in a broad sense) of the input signal IS. In FIG. 3, the test input signal IS and the delay signals DSM to DSN are pulse signals at the low level. However, the test input signal IS and the delay signals DSM to DSN may be pulse signals at the high level.

The comparison circuit 20 includes a comparison result register 30. The comparison circuit 20 stores comparison result data (delay measurement data or delay table value) of the pulse width time TP of the test input signal IS and the delay time of the delay signal in the delay circuit 10. In more detail, the comparison circuit 20 stores the comparison result data of the pulse width time TP and the delay times TDM to TDN of the delay signals DSM to DSN output from the taps PM to PN of the delay circuit 10 in the comparison result register 30. Taking FIG. 3 as an example, the delay times TDM to TDM+2 of the delay signals DSM to DSM+2 are judged to be shorter than the pulse width time TP by the comparison processing in the comparison circuit 20. The delay times TDM+3 to TDN of the delay signals DSM+3 to DSN are judged to be longer than the pulse width time TP. Therefore, the comparison result data stored in the comparison result register 30 is data which shows that the delay time TDM+2 or TDM+3 of the delay signal DSM+2 or DSM+3 approximately coincides with the pulse width time TP.

The adjustment circuit 40 adjusts the delay time of the delay signal in the delay circuit 10 based on adjustment data ADT, for example. For example, when the delay time of the delay signal in the delay circuit 10 is judged to be short based on the comparison result data stored in the comparison result register 30, the adjustment circuit 40 adjusts the delay time so that the delay time is increased. When the delay time of the delay signal in the delay circuit 10 is judged to be long based on the comparison result data stored in the comparison result register 30, the adjustment circuit 40 adjusts the delay time so that the delay time is decreased.

In more detail, when testing an integrated circuit device including the delay adjustment circuit, a tester reads the comparison result data stored in the comparison result register 30, and judges whether the delay time is short or long. When the delay time is short, the tester sets the adjustment data ADT which increases the delay time. The adjustment circuit 40 performs adjustment processing of increasing the delay time based on the set adjustment data ADT. When the delay time is long, the tester sets the adjustment data ADT which decreases the delay time. The adjustment circuit 40 performs adjustment processing of decreasing the delay time based on the set adjustment data ADT. In this case, the adjustment data ADT may be set using a fuse element or a nonvolatile memory element (rewritable nonvolatile memory element such as EEPROM) as described later. Specifically, the adjustment data ADT may be set by cutting a fuse element formed of aluminum or polysilicon, or reading data from a nonvolatile memory element.

As the delay adjustment method for the delay signal, a method of inputting an input signal to an integrated circuit device from a tester, measuring the delay time of an output signal which is a delay signal of the input signal using the tester, and adjusting the delay time based on the measurement result can be given. However, the parasitic capacitance (interconnect capacitance of an IC substrate of the tester or the like) added to an output terminal of an output I/O cell during testing is considerably large, and a CMOS transistor which forms the output I/O cell does not have a drive capability for charging/discharging such a large parasitic capacitance. Therefore, rounding of the waveform of the output signal from the output I/O cell occurs, whereby the tester cannot measure the accurate delay time of the output signal.

The drive capability of the tester is sufficiently high, and the gate capacitance of the CMOS transistor which forms an input I/O cell is sufficiently low in comparison with the drive capability. Therefore, the parasitic capacitance added to the input terminal of the input I/O cell does not adversely affect the signal delay or the like to a large extent, differing from the output I/O cell.

This embodiment employs the delay adjustment circuit having the configuration shown in FIG. 2 taking the above-described point into consideration. Specifically, when the test input signal IS as indicated by A1 in FIG. 3 is input from the tester, rounding of the waveform of the input signal IS rarely occurs since the drive capability of the tester is sufficiently high. Therefore, the test input signal IS having an accurate pulse width time TP can be input from the tester. The delay time in the delay circuit 10 can be accurately measured by comparing the accurate pulse width time TP of the input signal IS with the delay times TDM to TDN of the delay signals DSM to DSN using the comparison circuit 20 shown in FIG. 2. A signal which is delayed for a delay time approximately equal to the accurate pulse width time TP can be obtained by allowing the adjustment circuit 40 to adjust the delay time of the delay circuit 10 using the adjustment data ADT which is set based on the measurement result (comparison result data). It is possible to satisfy the user's strict demand for the specification of the AC characteristics by adjusting the AC characteristics such as the holding time THL shown in FIG. 1 based on the resulting delay signal.

3. Configuration Example of Delay Circuit and Comparison Circuit

Figure 4:
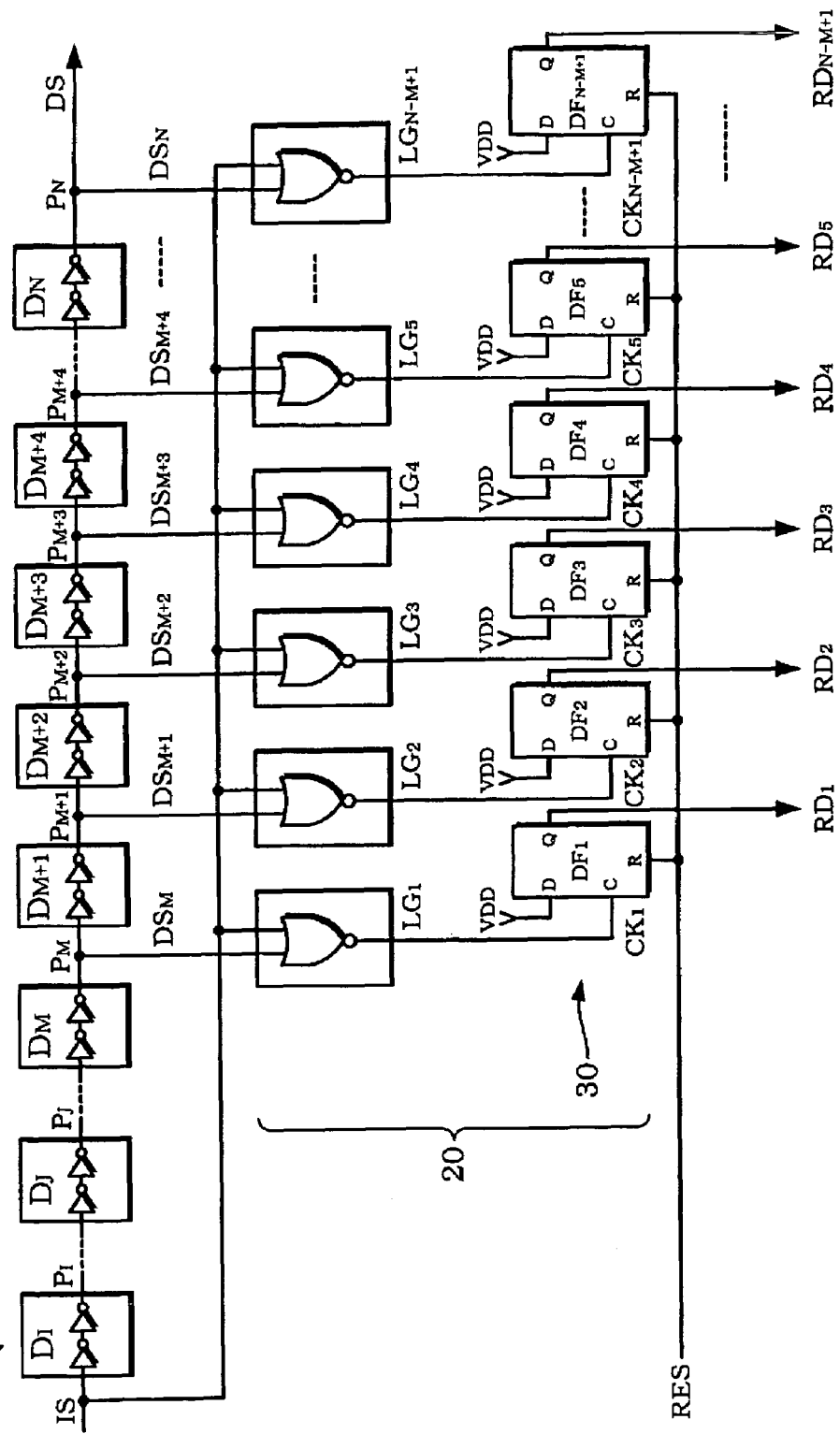
FIG. 4 shows a first configuration example of the delay circuit and the comparison circuit.

FIG. 4 shows a first configuration example of the delay circuit 10 and the comparison circuit 20.

Each of the delay units DI to DN included in the delay circuit 10 is formed by a serially-connected two-stage inverter circuit, for example. Each of the delay units DI to DN may be formed by a delay element other than the inverter circuit.

The comparison circuit includes first to (N−M+1)th logic circuits LG1 to LGN−M+1. In FIG. 4, each of the logic circuits LG1 to LGN−M+1 is formed by a NOR circuit. Each of the logic circuits LG1 to LGN−M+1 may be formed by a circuit having another configuration, such as a NAND circuit. The comparison result register 30 included in the comparison circuit 20 is formed by first to (N−M+1)th flip-flop circuits DF1 to DFN−M+1.

The test input signal IS having the pulse width time TP (including a signal obtained by buffering the test input signal IS or a signal obtained by inverting the test input signal IS) is input to first inputs of the logic circuits LG1 to LGN−M+1. The delay signals DSM to DSN from the taps PM to PN of the delay circuit 10 (including signals obtained by buffering the delay signals DSM to DSN or signals obtained by inverting the delay signals DSM to DSN) are respectively input to second inputs of the logic circuits LG1 to LGN−M+1.

Outputs from the logic circuits LG1 to LGN−M+1 (including signals obtained by buffering the outputs from the logic circuits LG1 to LGN−M+1 or signals obtained by inverting the outputs from the logic circuits LG1 to LGN−M+1) are respectively input to clock terminals of the flip-flop circuits DF1 to DFN−M+1 as clock signals CK1 to CKN−M+1. Comparison result data RD1 to RDN−M+1 is output from output terminals of the flip-flop circuits DF1 to DFN−M+1.

A power supply voltage VDD (first power supply voltage in a broad sense) is connected with data terminals of the flip-flop circuits DF1 to DFN−M+1, and a reset signal RES is connected with reset terminals of the flip-flop circuits DF1 to DFN−M+1. Data "0" (initial value data) is held by the flip-flop circuits DF1 to DFN−M+1 at the time of initialization when the reset signal RES becomes active.

The logic circuits LG1 to LGN−M+1 compare the input signal IS with the delay signals DSM to DSN, respectively, and the clock signals CK1 to CKN−M+1 become active (high level) in a period in which these signals are set at the low level (second level). Since the high-level power supply voltage VDD is connected with the data terminals of the flip-flop circuits DF1 to DFN−M+1, data "1" is written into and held by the flip-flop circuits at the rising edges (second edge) of the clock signals CK1 to CKN−M+1 when the clock signals CK1 to CKN−M+1 become active.

In FIG. 3, the clock signals CK1, CK2, and CK3 become active as indicated by A3, A4, and A5, for example. The data "1" is written into and held by the flip-flop circuits DF1 to DF3 at the rising edges of the clock signals CK1, CK2, and CK3. In FIG. 3, the clock signals CK4 to CKN−M+1 do not become active. Therefore, the flip-flop circuits DF4 to DFN−M+1, to which the clock signals CK4 to CKN−M+1 are respectively input, continuously hold the data "0" set using the reset signal RES.

Therefore, the comparison result data RD1 to RD3 output from the flip-flop circuits DF1 to DF3 become "1", and comparison result data RD4 to RDN−M+1 output from the flip-flop circuit DF4 to DFN−M+1 become "0". Therefore, the tester can obtain the measurement result in which the delay time TDM+2 or TDM+3 coincides with the pulse width time TP by reading the comparison result data RD1 to RDN−M+1. The delay time of the delay signal DS output from the delay circuit 10 can be set to an accurate time by setting the adjustment data ADT based on the measurement result. Specifically, the delay time of the delay signal DS can be caused to coincide with the delay pulse width TP, for example.

Figure 5:
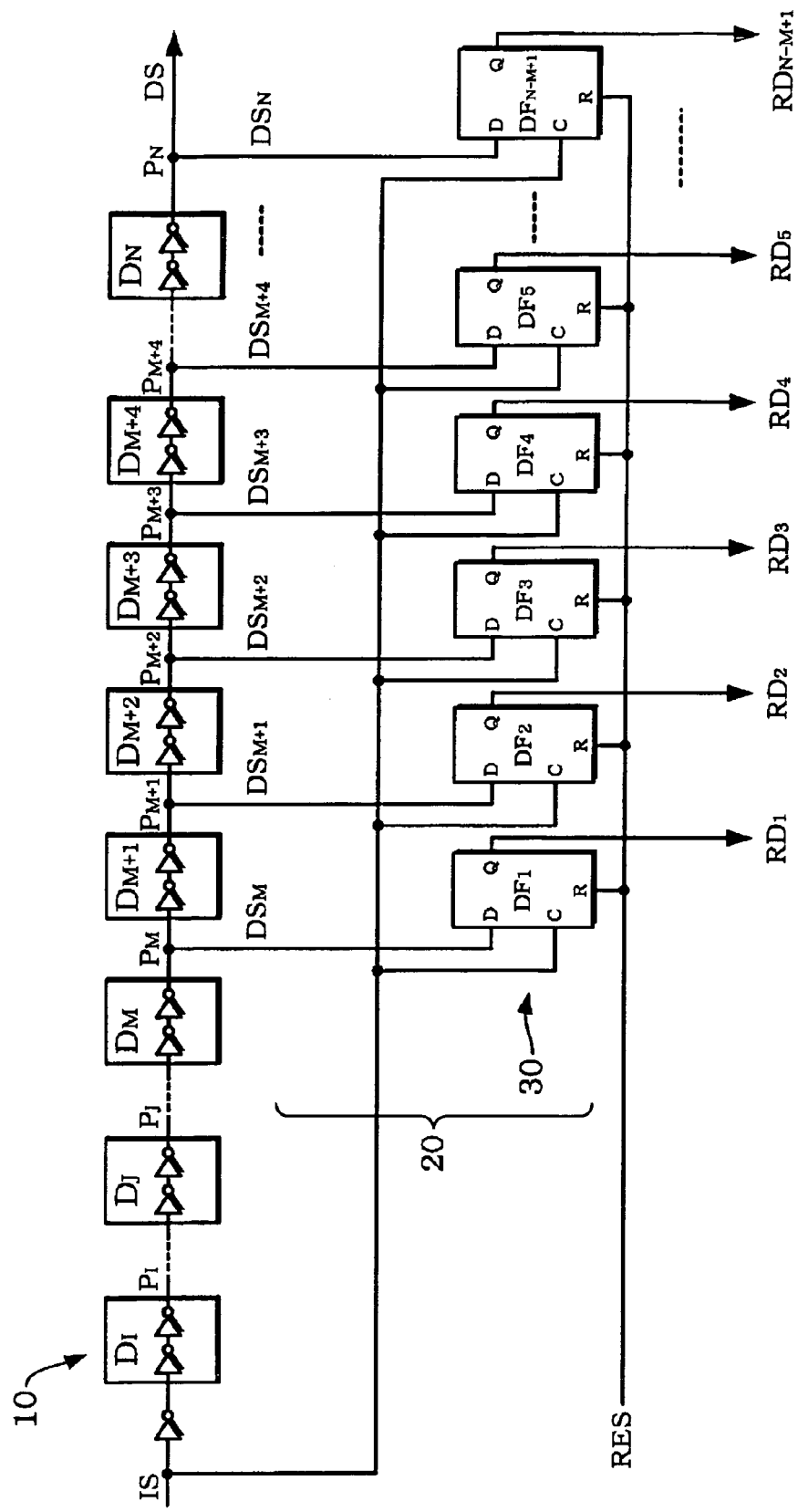
FIG. 5 shows a second configuration example of the delay circuit and the comparison circuit.

FIG. 5 shows a second configuration example of the delay circuit 10 and the comparison circuit 20. The second configuration example shown in FIG. 5 differs from the first configuration example shown in FIG. 4 in that the comparison circuit 20 shown in FIG. 5 does not include the logic circuits LG1 to LGN−M+1. The delay circuit and the comparison circuit in this embodiment are not limited to the configurations shown in FIGS. 4 and 5. Some of the circuits shown in FIGS. 4 and 5 may be omitted, or another circuit element may be added, or the connection configuration of the circuits may be changed.

The comparison result register 30 included in the comparison circuit 20 is formed by the first to (N−M+1)th flip-flop circuits DF1 to DFN−M+1.

The delay signals DSM to DSN from the taps PM to PN of the delay circuit 10 (including signals obtained by buffering the delay signals DSM to DSN or signals obtained by inverting the delay signals DSM to DSN) are respectively input to the data terminals of the flip-flop circuits DF1 to DFN−M+1. The test input signal IS (including a signal obtained by buffering the test input signal IS or a signal obtained by inverting the test input signal IS) is input to the clock terminals of the flip-flop circuits DF1 to DFN−M+1. The comparison result data RD1 to RDN−M+1 is output from the output terminals of the flip-flop circuits DF1 to DFN−M+1.

Figure 6:
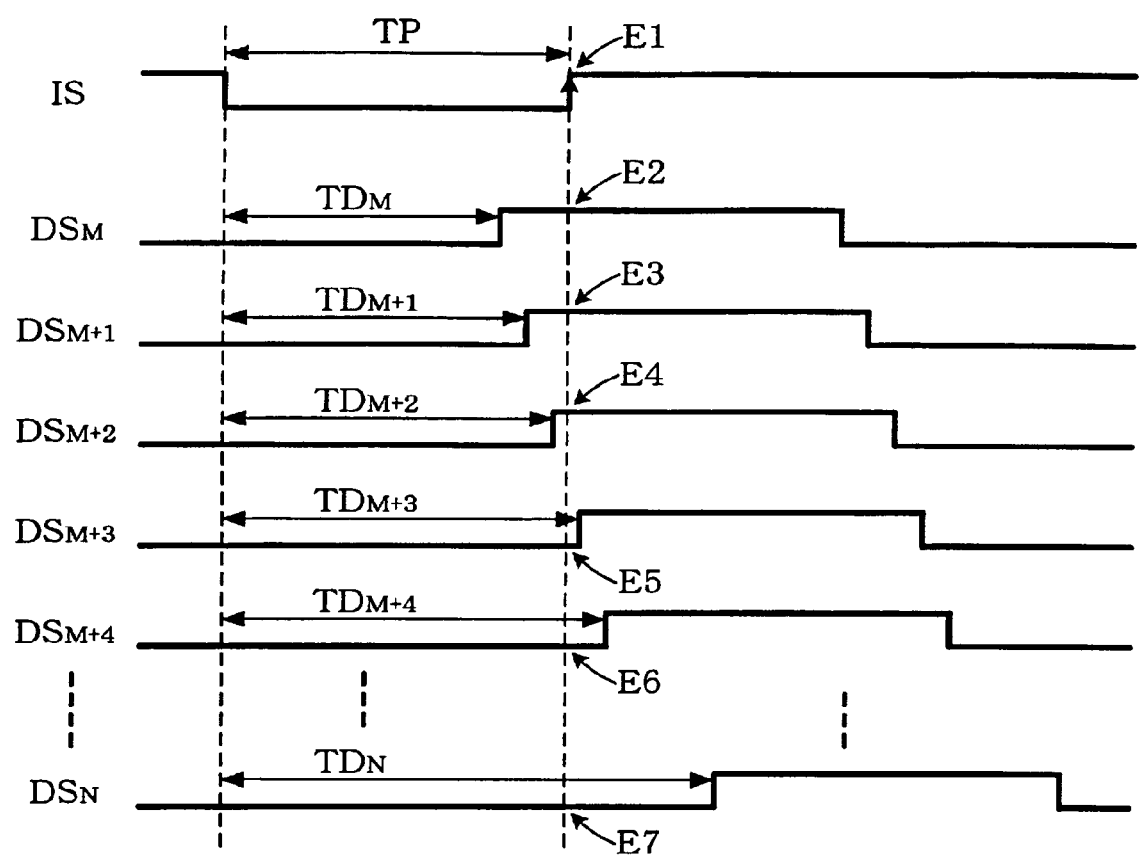
FIG. 6 shows a timing waveform diagram for describing the operation of the second configuration example.

FIG. 6 shows a timing waveform diagram for describing the operation of the second configuration example shown in FIG. 5.

The data "0" is held by the flip-flop circuits DF1 to DFN−M+1 at the time of initialization by causing the reset signal RES to become active.

The flip-flop circuits DF1 to DFN−M+1 hold data corresponding to the delay signals DSM to DSN at the rising edge (second edge in a broad sense) of the test input signal IS indicated by E1 in FIG. 6. For example, as indicated by E2 to E4 in FIG. 6, the flip-flop circuits DF1 to DF3, to which the delay signals DSM to DSM+2 are respectively input at the data terminals, hold the data "1". As indicated by E5 to E7 in FIG. 6, the flip-flop circuits DF4 to DFN−M+1, to which the delay signals DSM+3 to DSN are respectively input at the data terminals, hold the data "0".

Therefore, the comparison result data RD1 to RD3 respectively output from the flip-flop circuits DF1 to DF3 become "1", and the comparison result data RD4 to RDN−−M+1 respectively output from the flip-flop circuit DF4 to DFN−M+1 become "0". Therefore, the tester can obtain the measurement result in which the delay time TDM+2 or TDM+3 coincides with the pulse width time TP by reading the comparison result data RD1 to RDN−M+1.

4. Details of Adjustment Circuit

A detailed example of the adjustment circuit 40 is described below using FIGS. 7 and 8. The adjustment circuit 40 in this embodiment is not limited to the configuration shown in FIGS. 7 and 8. Some of the circuits may be omitted, or another circuit element may be added, or the connection configuration of the circuits may be changed.

Figure 7:
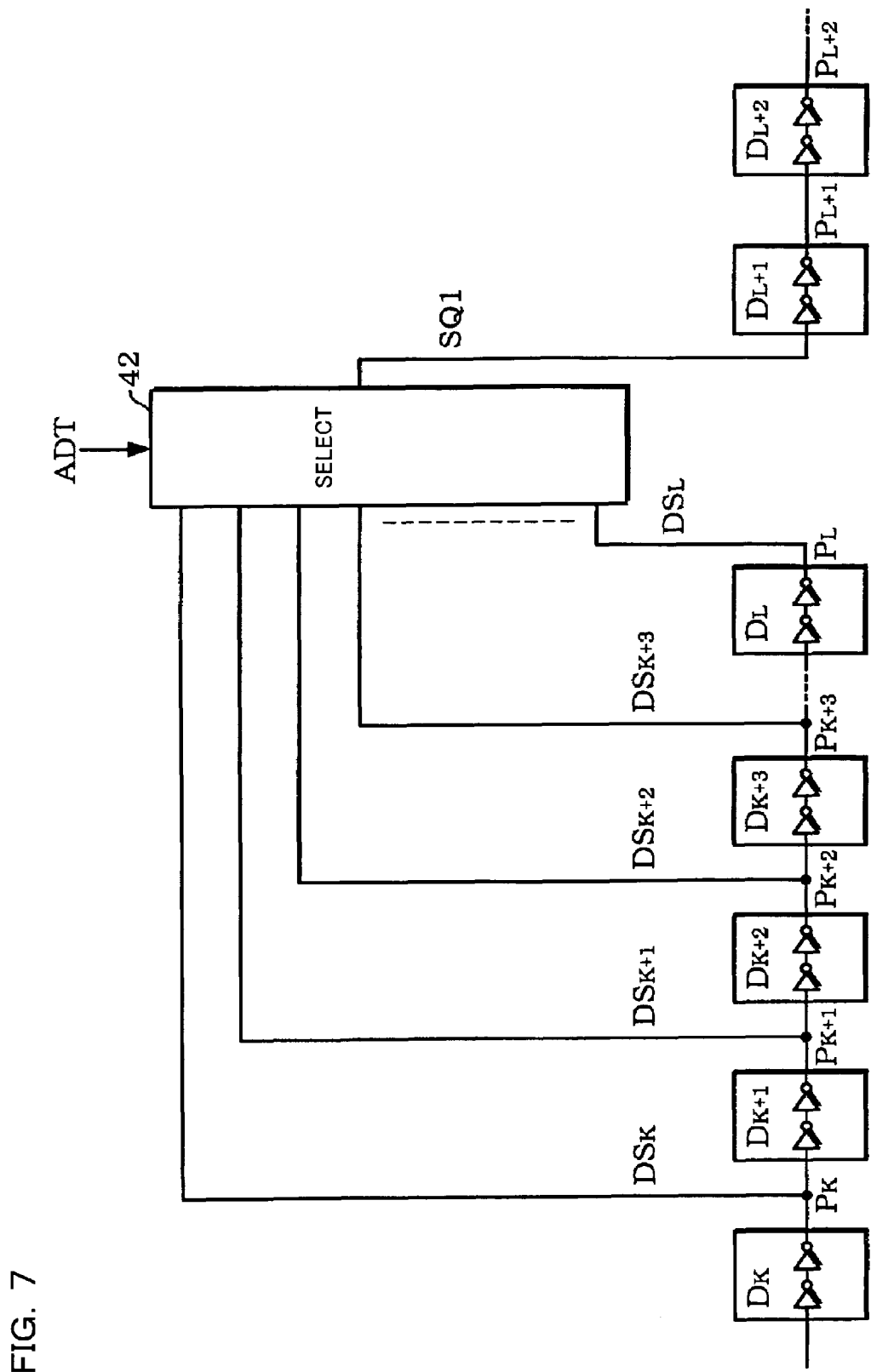
FIG. 7 shows a detailed example of the adjustment circuit.

As shown in FIG. 7, the adjustment circuit 40 may include a first select circuit 42 for delay time adjustment. The select circuit 42 is a circuit for adjusting variation of the delay time caused by process variation of the manufacturing lot of the integrated circuit device (IC) or the like. K-th to L-th delay signals DSK to DSL respectively output from K-th to L-th taps PK to PL of the delay circuit 10 are input to the select circuit 42. The select circuit 42 selects one of the delay signals DSK to DSL based on the adjustment data ADT for delay time adjustment, and outputs the selected delay signal as SQ1, for example.

The delay signal DSL output from the delay unit DL is not input to a delay unit DL+1 adjacent to the delay unit DL. The output SQ1 from the select circuit 42 is input to the delay unit DL+1. The output of the delay unit DL+1 is connected with an (L+1)th tap PL+1, and the tap PL+1 is connected with an input of a delay unit DL+2.

The configuration as shown in FIG. 7 enables an arbitrary delay unit to be bypassed by the select processing of the select circuit 42, whereby the delay time of the delay circuit 10 can be adjusted.

In a default state, the select circuit 42 selects the delay signal from the tap corresponding to the typical value which is the tap at the middle of the taps PK to PL, for example. When the delay time measured based on the comparison result data stored in the comparison result register 30 is judged to be longer than the typical value due to variation caused by process variation of the manufacturing lot, the delay time of the delay circuit 10 must be decreased. Therefore, the tester sets the data which decreases the delay time as the adjustment data ADT. When the data which minimizes the delay time is set as the adjustment data ADT, the select circuit 42 selects the delay signal DSK from the tap PK, for example. This causes the delay units DK+1 to DL to be bypassed, whereby the delay time of the delay circuit 10 is minimized. This enables variation of the delay time caused by process variation of the manufacturing lot to be absorbed.

When the delay time measured based on the comparison result data is judged to be shorter than the typical value due to variation caused by process variation of the manufacturing lot, the delay time must be increased. Therefore, the tester sets the data which increases the delay time as the adjustment data ADT. When the data which maximizes the delay time is set as the adjustment data ADT, the select circuit 42 selects the delay signal DSL from the tap PL, for example. This prevents the delay units DK+1 to DL from being bypassed, whereby the delay time of the delay circuit 10 is maximized. This enables variation of the delay time caused by process variation of the manufacturing lot to be absorbed.

In FIGS. 2 and 7, the delay time measurement taps PM to PN and the delay time adjustment taps PK to PL are separately provided. However, the taps PM to PN and PK to PL may be provided as common taps. Specifically, in this embodiment, the relationship among M, N K, and L may be N>M>L>K, or may be N=L and M=K.

Figure 8:
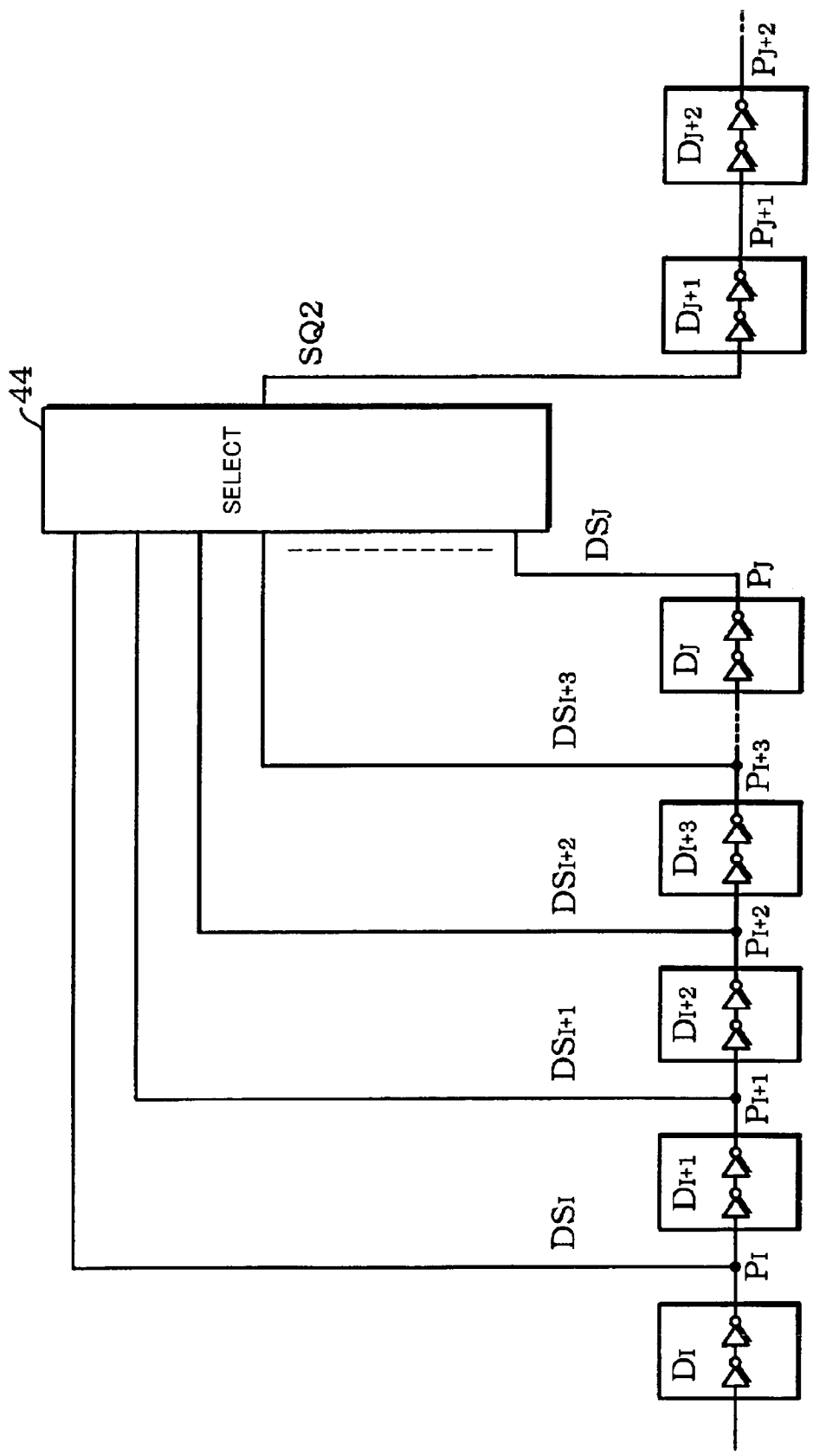
FIG. 8 shows another detailed example of the adjustment circuit.

As shown in FIG. 8, the adjustment circuit 40 may include a second select circuit 44 for setting the typical value of the delay time. The select circuit 44 is a circuit for adjusting the typical value of the delay time determined depending on the type of integrated circuit device. I-th to J-th delay signals DSI to DSJ respectively output from I-th to J-th taps PI to PJ of the delay circuit 10 are input to the select circuit 44. The select circuit 44 selects one of the delay signals DSI to DSJ, and outputs the selected delay signal as SQ2.

The delay signal DSJ output from the delay unit DJ is not input to a delay unit DJ+1 adjacent to the delay unit DJ. The output SQ2 from the select circuit 44 is input to the delay unit DJ+1. An output of the delay unit DJ+1 is connected with a (J+1)th tap PJ+1, and the tap PJ+1 is connected with an input of a delay unit DJ+2.

The delay time of the typical value of the delay circuit 10 can be adjusted by the configuration as shown in FIG. 8. Specifically, the typical value of the delay time of the delay circuit can be calculated by a circuit simulation. However, the parasitic capacitance of the interconnect in the circuit simulation generally differs from the parasitic capacitance of the interconnect of the actual integrated circuit device. Therefore, even if the typical value of the delay time is set according to the circuit simulation using an existing circuit library, the delay time of the delay circuit included in the actually manufactured integrated circuit device may not coincide with the set typical value. In this case, a setting in which the vicinity of the center of the adjustment range of the delay time by the select circuit 42 shown in FIG. 7 becomes the typical value can be achieved by setting the typical value of the delay time for each type by using the select circuit 44 shown in FIG. 8. This maximizes the width of the adjustment range by the select circuit 42 shown in FIG. 7, whereby a more suitable adjustment of the delay time can be realized.

For example, suppose that the typical value of the delay time of a specimen manufactured after the circuit simulation is the maximum value within the allowable range. In this case, the select circuit 44 selects the delay signal DSI from the delay unit DI. This causes the delay units DI+1 to DJ to be bypassed, whereby the delay time of the delay circuit 10 is minimized. This realizes a setting in which the center of the adjustment range of the delay time becomes the typical value.

Suppose that the typical value of the delay time of the specimen is the minimum value within the allowable range. In this case, the select circuit 44 selects the delay signal DSJ from the delay unit DJ. This prevents the delay units DI+1 to DJ from being bypassed, whereby the delay time of the delay circuit 10 is maximized. This realizes a setting in which the center of the adjustment range of the delay time becomes the typical value.

The select circuit 42 (selector) shown in FIG. 7 may be configured by a logic circuit which selects one of the delay signals DSK to DSL based on the adjustment data ADT. In the select circuit 44 shown in FIG. 8, the delay signal to be selected is fixed corresponding to the type of integrated circuit device. Therefore, the select circuit 44 need not necessarily include a logic circuit, and may be configured by an interconnect pattern (fixed interconnect pattern) determined by a mask pattern. However, the select circuit 44 shown in FIG. 8 may include a logic circuit for select processing, and may select the delay signal based on the adjustment data. In this case, the adjustment data fixed corresponding to the type of device is read from a nonvolatile memory element when providing power to the integrated circuit device, and the select circuit 44 selects the delay signal based on the adjustment data, for example.

5. Modification

Figure 9:
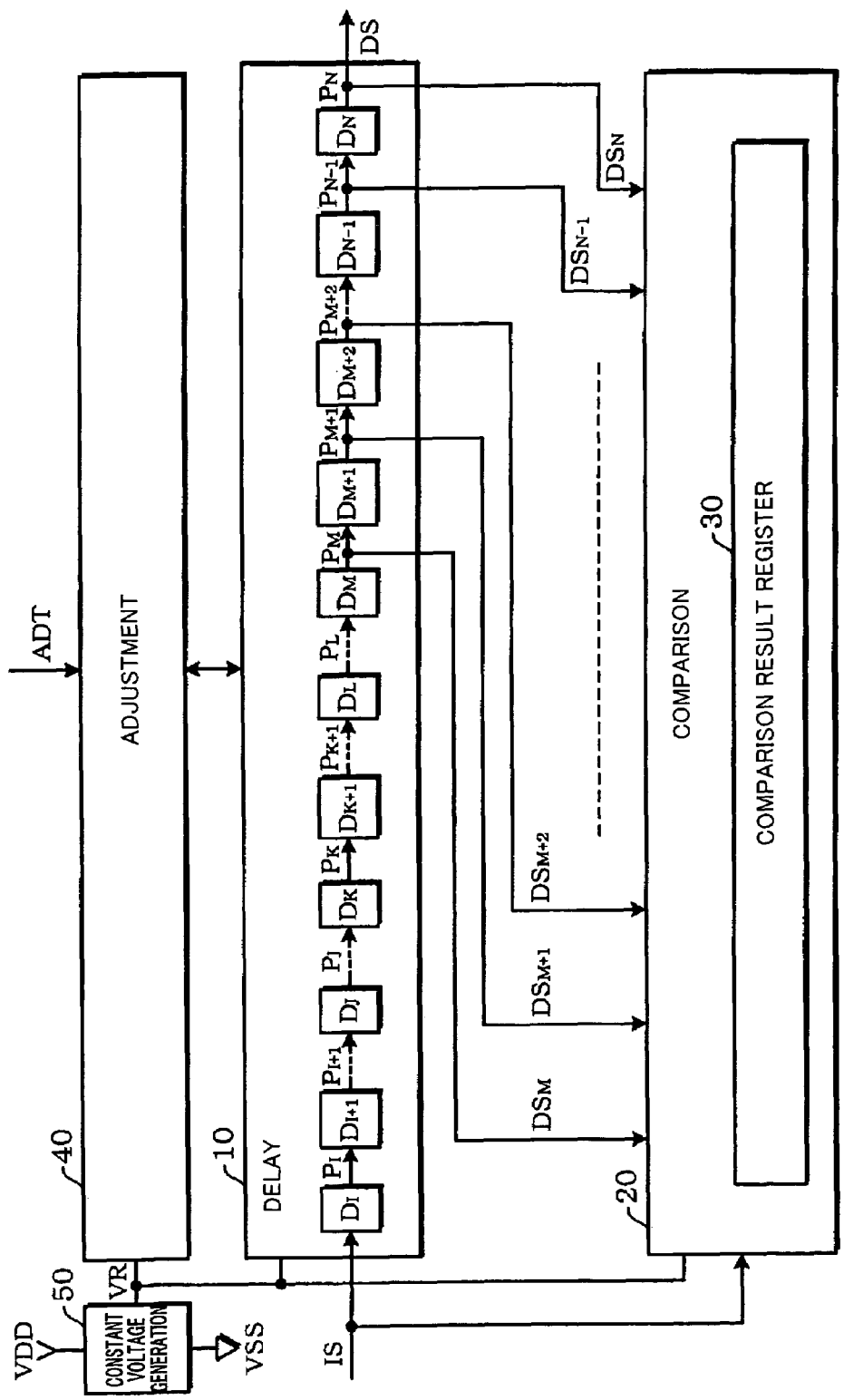
FIG. 9 shows a modification of the delay adjustment circuit.

FIG. 9 shows a modification of the delay adjustment circuit. The configuration shown in FIG. 9 differs from the configuration shown in FIG. 2 in that a constant voltage generation circuit 50 is provided in FIG. 9.

The constant voltage generation circuit 50 generates a constant voltage VR based on the power supply voltages (VDD and VSS), and outputs the generated constant voltage VR. In more detail, the constant voltage generation circuit 50 generates the constant voltage VR by regulating the power supply voltage VDD, for example. The generated constant voltage VR is supplied to the delay circuit 10, the comparison circuit 20, and the adjustment circuit 40, and these circuits operate using the constant voltage VR as the power supply voltage.

This enables the delay circuit 10 to operate based on the constant voltage VR which is always constant, even if the voltage level of the power supply voltage VDD changes. Therefore, the delay time of the delay units DI to DN of the delay circuit 10 does not depend on variation of the power supply voltage VDD, whereby the coefficient of variation of 0.85 to 1.15 caused by the power supply voltage can be disregarded. Therefore, it is possible to satisfy the user's strict demand for the specification of the AC characteristics by adjusting the AC characteristics such as the holding time THL shown in FIG. 1 based on the delay signal adjusted by the delay adjustment circuit having the configuration shown in FIG. 9.

In FIG. 9, the constant voltage VR is supplied to all of the delay circuit 10, the comparison circuit 20, and the adjustment circuit 40 as the power supply voltage. However, in this embodiment, it suffices that the constant voltage VR be supplied to at least the delay circuit 10. When supplying the constant voltage VR to only the delay circuit 10, a level shifter which converts the voltage level between the constant voltage VR and the power supply voltage VDD may be provided between the delay circuit 10 and the comparison circuit 20 or between the delay circuit 10 and the adjustment circuit 40, for example.

6. Integrated Circuit Device

Figure 10:
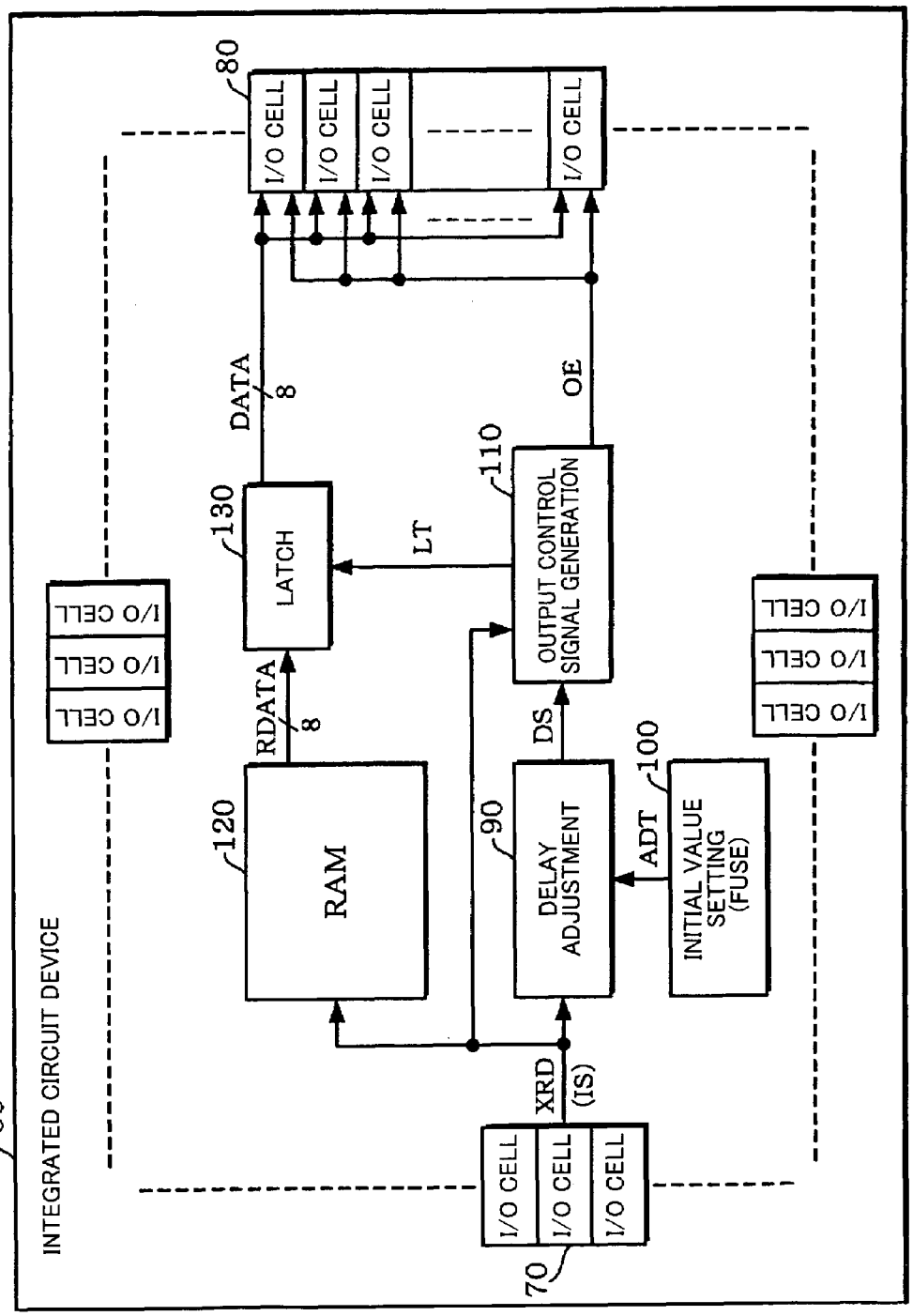
FIG. 10 shows a configuration example of an integrated circuit device.

FIG. 10 shows a configuration example of an integrated circuit device 60 in this embodiment. The integrated circuit device 60 in this embodiment is not limited to the configuration shown in FIG. 10. Some of the circuit blocks shown in FIG. 10 may be omitted, or another circuit block may be added, or the connection configuration of the circuit blocks may be changed.

The integrated circuit device 60 includes a first I/O cell 70 to which the read signal XRD (input signal IS in a broad sense) is input. The I/O cell 70 is an input I/O cell. The integrated circuit device 60 includes a second I/O cell 80 (cells for eight bits) to which the data signal DATA (output signal in a broad sense) is output. The I/O cell 80 is an output I/O cell or an input-output I/O cell.

The integrated circuit device 60 includes a delay adjustment circuit 90 described with reference to FIGS. 2 and 9, for example. The read signal XRD (IS) is input to the delay adjustment circuit 90 through the I/O cell 70, and the delay adjustment circuit 90 outputs the delay signal DS whose delay time is adjusted.

The integrated circuit device 60 includes an initial value setting circuit 100 (fuse circuit). The initial value setting circuit 100 is a circuit which outputs the adjustment data ADT for adjusting the delay time of the delay signal in the delay circuit 10. The initial value setting circuit 100 may include a fuse element (or nonvolatile memory element), a latch circuit which fetches and stores the setting state of the fuse element (or nonvolatile memory element), a latch clock generation circuit which generates a latch clock signal supplied to the latch circuit, and the like. The delay adjustment circuit 90 adjusts the delay time of the delay signal DS based on the adjustment data ADT from the initial value setting circuit 100. In more detail, a tester which has read the comparison result data stored in the comparison result register 30 shown in FIG. 2 performs processing of cutting the fuse element of the initial value setting circuit 100 (or processing of writing data into the nonvolatile memory element) based on the measurement result of the delay time. The initial value setting circuit 100 outputs the adjustment data ADT determined by the setting state of the fuse element after the cutting processing (data written into the nonvolatile memory element) to the delay adjustment circuit 90. This enables the delay time of the delay signal DS of the delay adjustment circuit 90 to be set to an optimum time corresponding to the measurement result.

The integrated circuit device 60 includes an output control signal generation circuit 110. The output control signal generation circuit 110 generates output control signals OE and LT of the data signal DATA output through the I/O cell 80 based on a delay signal DS from the delay adjustment circuit 90. The output control signal OE is an output enable signal of the I/O cell 80, and the output control signal LT is a latch clock signal of the latch circuit 130.

The integrated circuit device 60 includes a RAM 120 (memory in a broad sense) and the latch circuit 130. An 8-bit data signal RDATA read from the RAM 120 is latched by the latch circuit 130 based on the latch clock signal LT, for example. The 8-bit data signal DATA, which is the output from the latch circuit 130, is output to the outside through the I/O cell 80.

Figure 11:
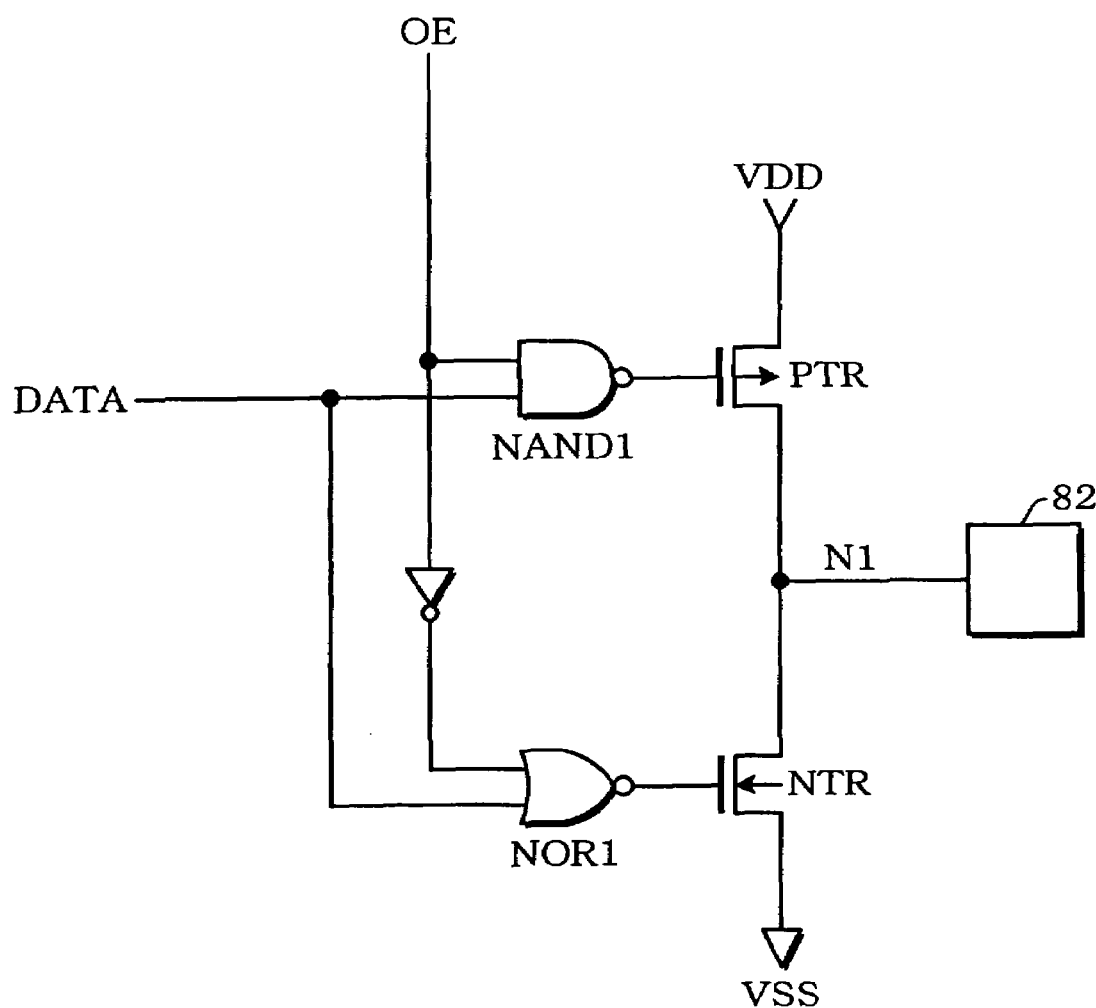
FIG. 11 is a configuration example of an output I/O cell.

FIG. 11 shows a specific example of the I/O cell 80. When the output enable signal OE is set at the low level, outputs from NAND1 and NOR1 are respectively fixed at the high level and the low level. Therefore, transistors PTR and NTR are turned OFF, whereby a node N1 connected with a pad 82 of the I/O cell 80 is set in a high impedance state.

When the output enable signal OE is set at the high level, NAND1 and NOR1 are set in a conducting state. Therefore, the transistor PTR is turned ON when the data signal DATA is set at the high level, whereby the node N1 connected with the pad 82 is set at the high level. The transistor NTR is turned ON when the data signal DATA is set at the low level, whereby the node N1 is set at the low level.

Figure 12:
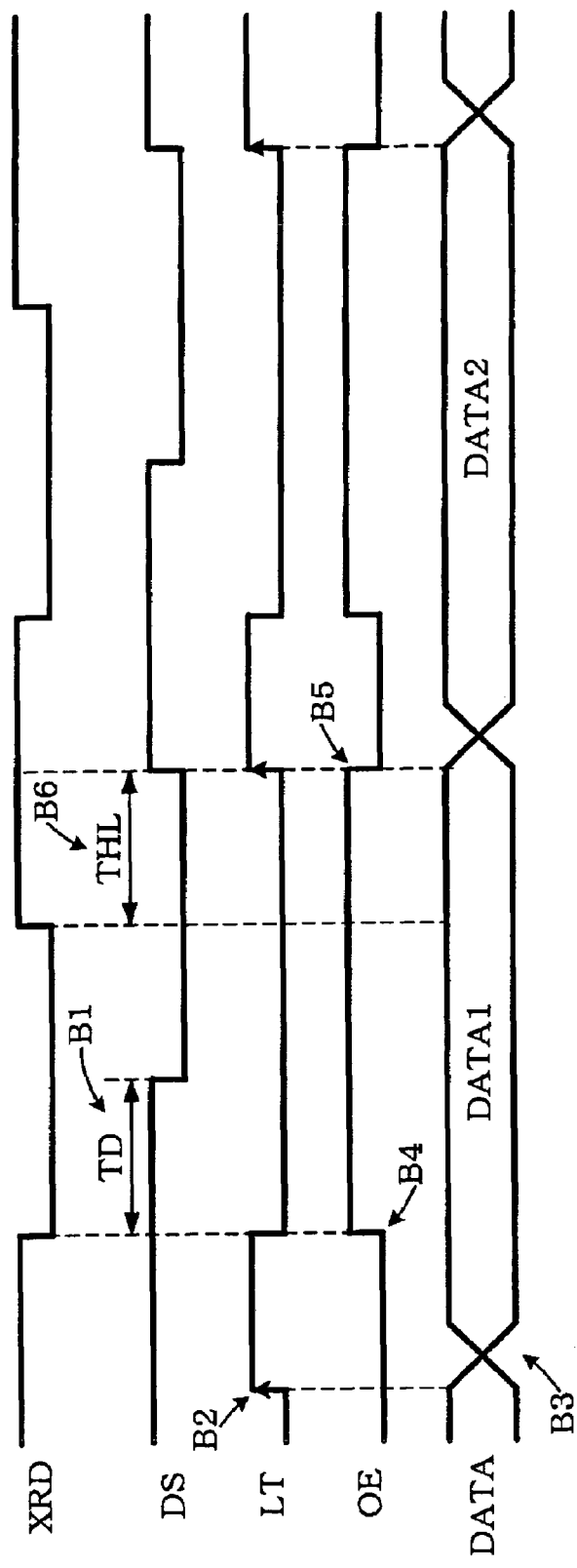
FIG. 12 is a timing waveform example of various signals of an integrated circuit device.

FIG. 12 shows a timing waveform example of the signals XRD, DS, LT, OE, and DATA. As indicated by B1 in FIG. 12, the delay signal DS is a signal generated by delaying the read signal XRD for the delay time TD. The delay time TD is adjusted by the delay adjustment circuit 90 based on the adjustment data ADT.

The latch clock signal LT is generated by the output control signal generation circuit 110 based on the read signal XRD, the delay signal DS, and the like. For example, the latch clock signal LT may be generated by calculating the logical AND of the read signal XRD and the delay signal DS. As indicated by B2 and B3 in FIG. 12, the latch circuit 130 latches the data signal RDATA from the RAM 120 at the rising edge of the latch clock signal LT, and outputs the data signal DATA.

The output enable signal OE is also generated by the output control signal generation circuit 110 based on the read signal XRD, the delay signal DS, and the like. For example, when the read signal XRD becomes active (low level), the output enable signal OE becomes active (high level) as indicated by B4 in FIG. 12. When the delay signal DS becomes inactive (high level), the output enable signal OE becomes inactive (low level) as indicated by B5.

The holding time THL indicated by B6 in FIG. 12 can be suitably set by allowing the output control signal generation circuit 110 to generate the latch clock signal LT and the output enable signal OE as described above. As is clear from FIG. 12, the length of the holding time THL is determined by the delay time TD of the delay signal DS. According to the method of this embodiment, the delay adjustment circuit 90 can output the signal DS which is delayed for the delay time TD with an accurate length which depends on process variation to only a small extent. Therefore, the length of the holding time THL depends on the process variation to only a small extent. As a result, it is possible to satisfy the user's strict demand for the specification of the AC characteristics of the holding time THL.

7. Initial State Setting Circuit

Figure 13:
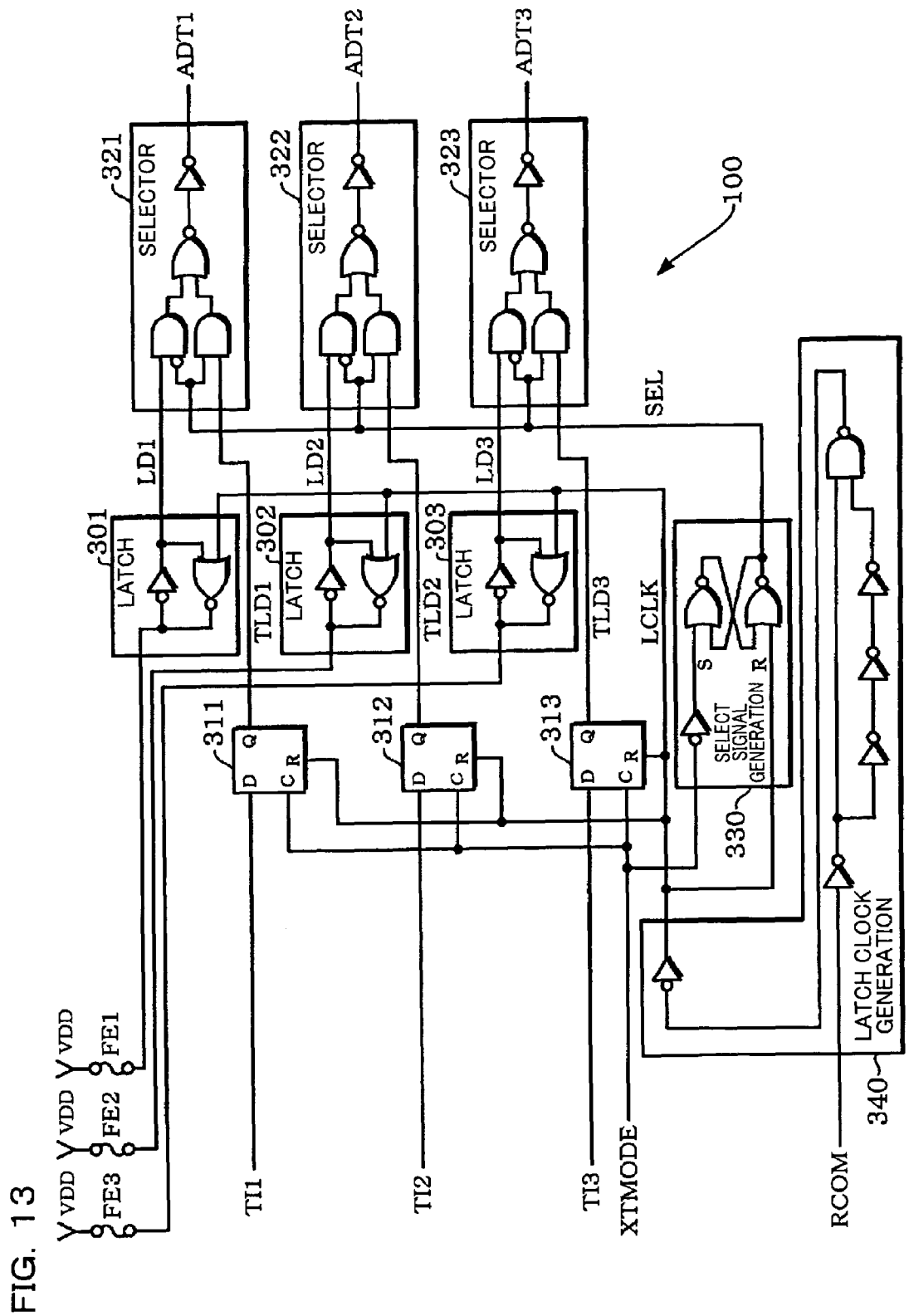
FIG. 13 is a configuration example of an initial state setting circuit.

FIG. 13 shows a configuration example of the initial state setting circuit 100 (fuse circuit) shown in FIG. 10. The initial state setting circuit 100 in this embodiment is not limited to the configuration shown in FIG. 13. Some of the circuits shown in FIG. 13 may be omitted, or another circuit element may be added, or the connection configuration of the circuits may be changed. For example, the initial state setting circuit 100 may have a configuration in which a test circuit (flip-flop circuit which holds a test signal and a selector) is omitted. The number of bits of the fuse element is not limited to three. The number of bits may be two or four or more. A nonvolatile memory element (nonvolatile memory element whose data can be rewritten such as EEPROM) may be used instead of the fuse element.

The initial state setting circuit 100 includes fuse elements FE1, FE2, and FE3 (or nonvolatile memory elements), latch circuits 301, 302, and 303, flip-flop circuits 311, 312, and 313 which hold a test signal, selectors 321, 322, and 323, a select signal generation circuit 330, and a latch clock generation circuit 340. The initial state setting circuit 100 may have a configuration in which some of these circuits are omitted.

The power supply voltage VDD (first power supply voltage) is connected with one end of the fuse elements FE1, FE2, and FE3. Therefore, when the fuse elements FE1 to FE3 are not cutting, the voltage level of the other end of the fuse elements FE1 to FE3 is approximately at the power supply voltage VDD. The latch circuits 301, 302, and 303 are respectively connected with the other end of the fuse elements FE1, FE2, and FE3.

The latch circuits 301 to 303 fetch and store the setting states (cutting state or uncut state) of the fuse elements FE1 to FE3 (or nonvolatile memory elements) as adjustment data (ADT1 to ADT3). In more detail, the latch circuits 301 to 303 fetch data (logical level) corresponding to the voltage levels of the other end of the fuse elements FE1 to FE3, and output the latch data LD1 to LD3. For example, when the fuse elements FE1 to FE3 are in the uncut state, the voltage level of the other end of the fuse elements FE1 to FE3 is approximately at the power supply voltage VDD. Therefore, the latch circuit 301 holds the data "1", and outputs the data "0" as latch data LD1. When the fuse element FE1 is in the cutting state, the other end of the fuse element FE1 is in an open state. Therefore, the latch circuit 301 holds the data "0" which is set when a latch clock signal LCLK becomes active, and outputs the data "1" as the latch data LD1. The same description also applies to the latch circuits 302 and 303.

The fuse elements FE1 to FE3 cannot be restored after the fuse elements FE1 to FE3 are cut. In the initial state setting circuit 100 shown in FIG. 13, a state equivalent to the state in which the fuse elements FE1 to FE3 are cut can be created by using test signals TI1 to TI3. Therefore, whether or not the state created by the setting states of the fuse elements FE1 to FE3 is within the allowable range can be confirmed in advance. Therefore, the flip-flop circuits 311 to 313 respectively hold the test signals TI1 to TI3 at the falling edge of a test mode setting signal XTMODE, and output the test signals TI1 to TI3 as test latch data TLD1 to TLD3. The selectors 321 to 323 respectively select the test latch data TLD1 to TLD3 during the test mode based on a select signal SEL, and output the test latch data TLD1 to TLD3 as the adjustment data ADT1 to ADT3.

The select signal generation circuit 330 generates the select signal SEL and outputs the select signal SEL to the selectors 321 to 323. In more detail, the select signal generation circuit 330 includes an RS flip flop. The RS flip-flop generates the select signal SEL by using an inverted signal of the test mode setting signal XTMODE as a set signal and the latch clock signal LCLK as a reset signal. In more detail, the select signal SEL is set at the high level when a low-level pulse is input as the test mode setting signal XTMODE, whereby the selectors 321 to 323 respectively select the test latch data TLD1 to TLD3. The select signal SEL is set at the low level when a high-level pulse is input as the latch clock signal LCLK, whereby the selectors 321 to 323 respectively select the latch data LD1 to LD3 set by the fuse elements FE to FE3.

The latch clock generation circuit 340 generates the latch clock signal LCLK for allowing the latch circuits 301 to 303 to fetch the setting states of the fuse elements FE1 to FE3 (or nonvolatile memory elements). In a signal timing waveform example shown in FIG. 14, when a high-level pulse is input as a signal RCOM as indicated by C1, the latch clock signal LCLK having a pulse width corresponding to the delay time for three stages of inverter circuits based on the falling edge of the input pulse is generated as indicated by C2. The latch circuits 301 to 303 respectively fetch the setting states of the fuse elements FE to FE3 based on the generated pulse of the latch clock signal LCLK, and output the latch data LD1 to LD3 corresponding to the setting states of the fuse elements FE1 to FE3. Since the select signal SEL is reset to the low level by the pulse of the latch clock signal LCLK, the selectors 321 to 323 respectively select the latch data LD1 to LD3 from the latch circuits 301 to 303, and output the latch data LD1 to LD3 as the adjustment data ADT1 to ADT3. The adjustment data ADT1 to ADT3 corresponding to the setting states of the fuse elements FE to FE3 is output from the initial state setting circuit 100 in this manner.

The content of the latch circuits 301 to 303 (setting states of the fuse elements FE1 to FE3) may be changed when external noise such as static electricity occurs. Therefore, it is preferable to periodically perform the processing of allowing the latch circuits 301 to 303 to fetch the setting states of the fuse elements FE to FE3. In more detail, when the integrated circuit device is a liquid crystal driver, a frame signal, a display ON signal, or the like is input to the latch clock generation circuit 340. The setting states of the fuse elements FE to FE3 are periodically fetched by the latch circuits 301 to 303 (periodically refreshed) by periodically generating the pulse of the latch clock signal LCLK.

However, a shoot-through current flows through the latch circuit connected with the fuse element in the uncut state by performing such periodic fetch processing (periodic refreshing), whereby a reduction of power consumption is hindered. On the other hand, it suffices that the adjustment data ADT1 to ADT3 output from the initial state setting circuit 100 be set before the read signal XRD (input signal IS) shown in FIG. 7 becomes active.

Figure 14:
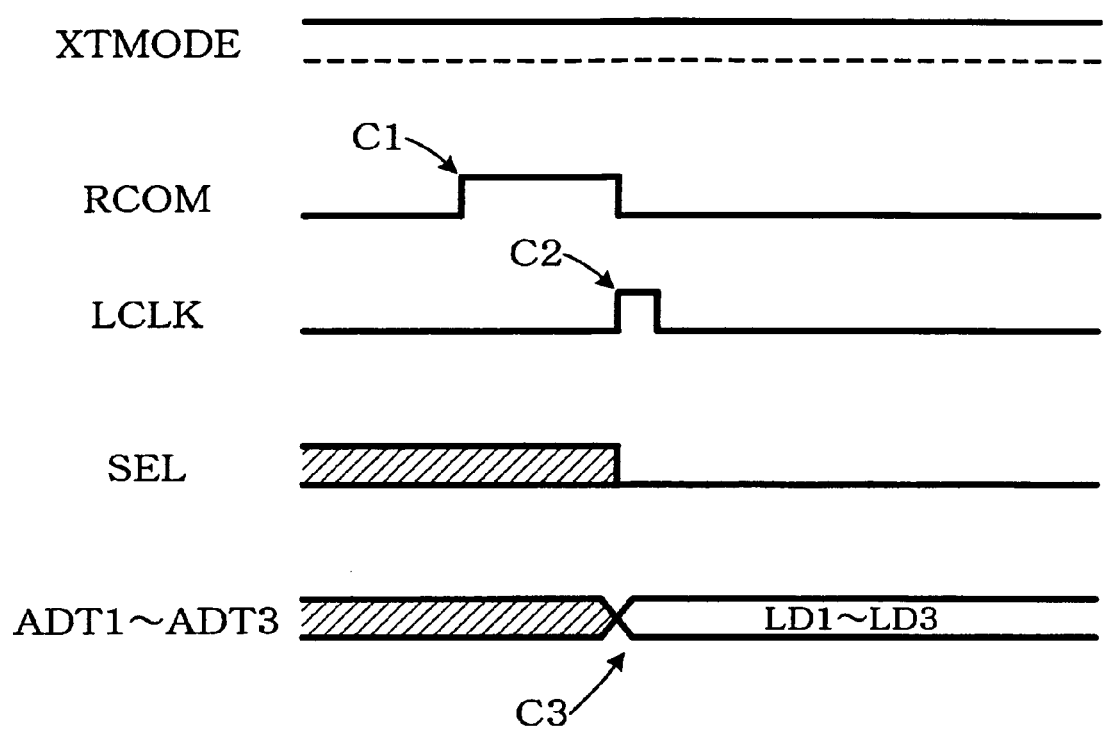
FIG. 14 is a timing waveform example for describing an operation of an initial state setting circuit.

Therefore, in this embodiment, the latch clock generation circuit 340 generates the latch clock signal and outputs the latch clock signal to the latch circuits 301 to 303 before the read signal XRD (input signal IS) is input to the delay circuit 10. The latch circuits 301 to 303 fetch the setting states of the fuse elements (or nonvolatile memory elements) based on the latch clock signal before the read signal XRD (input signal IS) is input to the delay circuit 10. In more detail, the signal RCOM (signal which becomes active when a read related operation is performed) as indicated by C1 in FIG. 14 is input to the latch clock generation circuit 340 before the read signal XRD becomes active (low level). The latch clock generation circuit 340 generates the latch clock signal LCLK and outputs the latch clock signal LCLK to the latch circuits 301 to 303 before the read signal XRD becomes active (low level), and the latch circuits 301 to 303 fetch the setting states of the fuse elements FE1 to FE3 as the adjustment data.

This allows the fetch processing (refresh processing) of the setting states of the fuse elements FE1 to FE3 in the latch circuits 301 to 303 to be performed only when the read signal XRD is input. Therefore, power consumption of the device can be reduced in comparison with the case of performing the fetch processing using a periodic signal.

8. Delay Adjustment Method

Figures 15A, 15B:
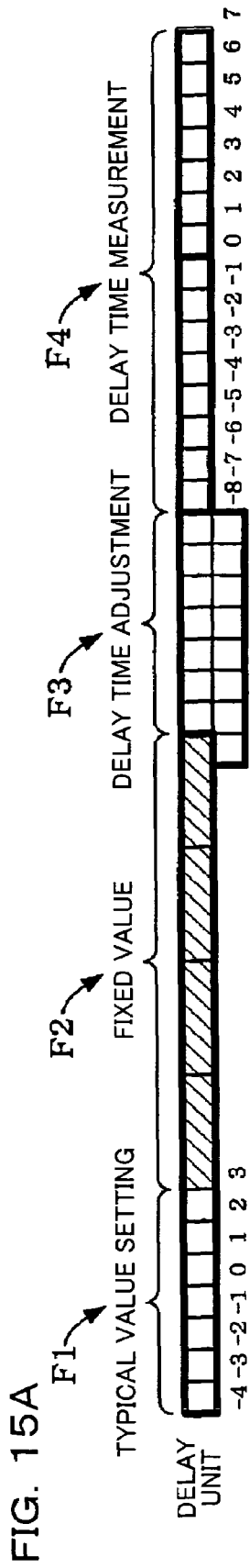
FIGS. 15A and 15B describe a delay adjustment method of an embodiment of the present invention.

A delay adjustment method in this embodiment is described below in detail. FIG. 15A schematically shows the delay units shown in FIG. 2.

For example, the typical value setting delay units indicated by F1 in FIG. 15A correspond to the delay units DI to DJ shown in FIG. 2. The fixed value delay units indicated by F2 correspond to the delay units provided between the delay units DJ and DK. The delay time adjustment delay units indicated by F3 correspond to the delay units DK to DL. The delay time measurement delay units indicated by F4 correspond to the delay units DM to DN.

In this embodiment, the delay time in the delay circuit 10 is measured by using the delay time measurement delay units (DM to DN) indicated by F4. The adjustment data is set based on the measured delay time (comparison result data). The delay time in the delay circuit 10 is adjusted by using the delay time adjustment delay units (DK to DL) indicated by F3. The typical value of the delay time which differs depending on the type of integrated circuit device is set by using the typical value setting delay units (DI to DJ) indicated by F1.

FIG. 15B is a diagram showing the relationship between data measured by the delay time measurement delay units (DM to DN) and the setting states of the fuse elements FE4 to FE1. In FIG. 15B, "0" means that the fuse elements FE4 to FE1 are allowed to remain in the uncut state, and "1" means that the fuse elements FE4 to FE1 are set in the cut state. FIG. 15B shows an example in which the fuse elements are four bits differing from FIG. 13.

For example, when the data measured by the delay time measurement delay units (DM to DN) indicated by F4 is "0" and the delay time is the typical value, all the fuse elements FE1 to FE4 are allowed to remain in the uncut state. When the measured data is "−8" and the delay time is short, only the fuse element FE4 is set in the cut state. When the measured data is "7" and the delay time is long, the fuse elements FE3, FE2, and FE1 are set in the cut state. The initial value setting circuit 100 shown in FIG. 13 outputs the adjustment data based on the fuse elements FE1 to FE4 set as described above. The adjustment circuit 40 performs the adjustment processing using the delay time adjustment delay units (DK to DL) based on the adjustment data, whereby a delay time which depends on the process variation or the like to only a small extent can be obtained.

Figure 16:
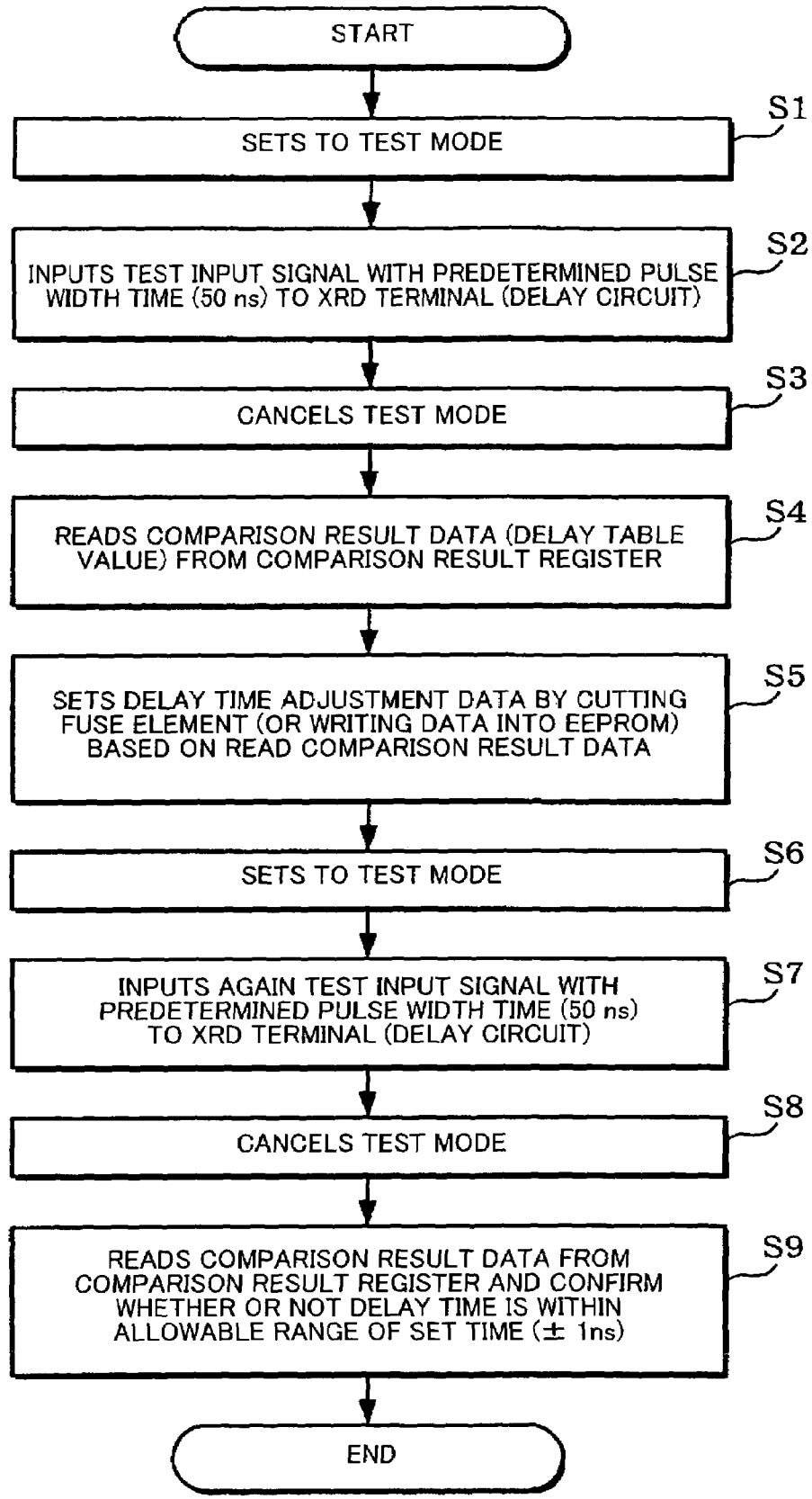
FIG. 16 is a flowchart showing the procedure of the delay adjustment method in this embodiment.

FIG. 16 is a flowchart showing the procedure of the delay adjustment method in this embodiment.

The integrated circuit device is set in the test mode (step S1). The test input signal with a predetermined pulse width time (50 ns, for example) is input to the XRD terminal (delay circuit) (step S2). The test mode is then canceled (step S3).

The comparison result data (delay table value or delay measurement data) is read from the comparison result register (step S4). The fuse element is cut (or data is written into EEPROM) based on the read comparison result data to set the adjustment data of the delay time (step S5).

The integrated circuit device is set in the test mode (step S6), and the test input signal with a predetermined pulse width time (50 ns, for example) is input again to the XRD terminal (delay circuit) (step S7). The test mode is then canceled (step S8).

The comparison result data is read from the comparison result register, and whether or not the delay time is within the allowable range (+/−1 ns) of the set time is confirmed (step S9).

As a method for confirming that a desired fuse element is cut with certainty, a confirmation method of allowing the tester to measure the delay value of the output signal from the output I/O cell 80 shown in FIG. 10 after setting the adjustment data in the step S5 in FIG. 16 can be given, for example.

However, the parasitic capacitance added to the output terminal of the output I/O cell 80 during testing is very large, and the drive capability of the output I/O cell 80 is low, as described above. Therefore, rounding of the waveform of the output signal from the output I/O cell 80 occurs, whereby an accurate delay time cannot be measured.

In this embodiment, the test input signal with a predetermined pulse width time is input again as indicated by the step S7 after setting the adjustment data in the step S5 in FIG. 16. As indicated by the step S9, the comparison result data is read, and whether or not the delay time is within the allowable range of the set time is confirmed.

This enables whether or not a desired fuse element is cut with certainty to be securely confirmed merely by reading the comparison result data. Therefore, complexity of the test can be reduced and reliability of the test can be improved in comparison with the method of measuring the delay time using the tester after adjusting the delay time.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

Any term cited with a different term having broader or the same meaning at least once in this specification and drawings can be replaced by the different term in any place in this specification and drawings.

The configurations of the delay adjustment circuit, delay circuit, comparison circuit, comparison result register, integrated circuit device, and the like are not limited to the configurations described in detail with reference to FIGS. 2 to 10 and the like. Various modifications can be made.

What is claimed is:

1. A delay adjustment circuit, comprising:
   a delay circuit to which an input signal is input, the delay circuit including a plurality of delay units and outputting a delay signal of the input signal;
   a comparison circuit which stores, to a comparison result register, comparison result data of a pulse width time of a pulse of a test input signal which is the input signal in a test mode and M-th to N-th (M and N are integers provided that N>M) delay times of M-th to N-th delay signals, the test input signal being input to the delay circuit and the M-th to N-th delay signals being respectively output from M-th to N-th taps among a plurality of taps provided between the delay units of the delay circuit;
   an adjustment circuit which adjusts delay time of the delay signal of the input signal in the delay circuit,
   wherein the adjustment circuit includes a second select circuit for typical value setting to which I-th to J-th (I and J are integers provided that J>I) delay signals are input and which selects and outputs one of the I-th to J-th delay signals, the I-th to J-th delay signals being respectively output from I-th to J-th taps among the plurality of taps of the delay circuit, and
   wherein the output from the second select circuit is input to a (J+1)th delay unit among the plurality of the delay units, a (J+1)th tap among the plurality of taps of the delay circuit being provided to an output of the (J+1)th delay unit.

2. A delay adjustment circuit, comprising:
   a delay circuit to which an input signal is input, the delay circuit including a plurality of delay units and outputting a delay signal of the input signal;
   a comparison circuit which stores, to a comparison result register, comparison result data of a pulse width time of a pulse of a test input signal which is the input signal in a test mode and M-th to N-th (M and N are integers provided that N>M) delay times of M-th to N-th delay signals, the test input signal being input to the delay circuit and the M-th to N-th delay signals being respectively output from M-th to N-th taps among a plurality of taps provided between the delay units of the delay circuit;
   an adjustment circuit which adjusts delay time of the delay signal of the input signal in the delay circuit,
   wherein the comparison circuit includes first to (N−M+1)th logic circuits and the comparison result register which includes first to (N−M+1)th flip-flop circuits, and
   wherein the test input signal is input to a first input of each of the first to (N−M+1)th logic circuits, the M-th to N-th delay signals are respectively input to second inputs of the first to (N−M+1)th logic circuits, and outputs from the first to (N−M+1)th logic circuits are respectively input to clock terminals of the first to (N−M+1)th flip-flop circuits.

3. The delay adjustment circuit as defined in claim 1,
   wherein the comparison circuit includes the comparison result register which includes first to (N−M+1)th flip-flop circuits, and
   wherein the M-th to N-th delay signals are respectively input to data terminals of the first to (N−M+1)th flip-flop circuits, and the test input signal is input to a clock terminal of each of the first to (N−M+1)th flip-flop circuits.

4. The delay adjustment circuit as defined in claim 1,
   wherein the adjustment circuit includes a first select circuit for delay time adjustment to which K-th to L-th (K and L are integers provided that L>K) delay signals are input and which selects and outputs one of the K-th to L-th delay signals, the K-th to L-th delay signals being respectively output from K-th to L-th taps among the plurality of taps of the delay circuit, and wherein the output from the first select circuit is input to an (L+1)th delay unit among the plurality of the delay units, an (L+1)th tap among the plurality of taps of the delay circuit being provided to an output of the (L+1)th delay unit.

5. The delay adjustment circuit as defined in claim 1, comprising:
a constant voltage generation circuit which generates a constant voltage,
wherein the delay circuit operates using the constant voltage generated by the constant voltage generation circuit as a power supply voltage.

6. A delay adjustment circuit, comprising:
a delay circuit to which an input signal is input, the delay circuit including a plurality of delay units and outputting a delay signal of the input signal;
a comparison circuit which stores, to a comparison result register, comparison result data of a pulse width time of a pulse of a test input signal which is the input signal in a test mode and M-th to N-th (M and N are integers provided that N>M) delay times of M-th to N-th delay signals, the test input signal being input to the delay circuit and the M-th to N-th delay signals being respectively output from M-th to N-th taps among a plurality of taps provided between the delay units of the delay circuit; and
an adjustment circuit which adjusts delay time of the delay signal of the input signal in the delay circuit,
an initial state setting circuit which outputs adjustment data for adjusting the delay time of the delay signal of the input signal,
wherein the adjustment circuit adjusts the delay time of the delay signal of the input signal based on the adjustment data output from the initial state setting circuit.

7. The delay adjustment circuit as defined in claim 6,
wherein the initial state setting circuit includes:
a latch circuit which fetches and stores a setting state of a fuse element or a nonvolatile memory element as the adjustment data; and
a latch clock generation circuit which generates a latch clock signal for allowing the latch circuit to fetch the setting state of the fuse element or the nonvolatile memory element,
wherein the latch clock generation circuit generates the latch clock signal and outputs the latch clock signal to the latch circuit before the input signal is input to the delay circuit, and
wherein the latch circuit fetches the setting state of the fuse element or the nonvolatile memory element based on the generated latch clock signal before the input signal is input to the delay circuit.

8. An integrated circuit device, comprising:
a first I/O cell to which an input signal is input;
a second I/O cell from which an output signal is output;
the delay adjustment circuit as defined in claim 1 to which the input signal is input through the first I/O cell and which outputs the delay signal of the input signal, delay time of which has been adjusted; and
an output control signal generation circuit which generates an output control signal of the output signal output through the second I/O cell based on the delay signal from the delay adjustment circuit.

9. An integrated circuit device, comprising:
a first I/O cell to which an input signal is input;
a second I/O cell from which an output signal is output;
the delay adjustment circuit as defined in claim 2 to which the input signal is input through the first I/O cell and which outputs the delay signal of the input signal, delay time of which has been adjusted; and
an output control signal generation circuit which generates an output control signal of the output signal output through the second I/O cell based on the delay signal from the delay adjustment circuit.

10. An integrated circuit device, comprising:
a first I/O cell to which an input signal is input;
a second I/O cell from which an output signal is output;
the delay adjustment circuit as defined in claim 3 to which the input signal is input through the first I/O cell and which outputs the delay signal of the input signal, delay time of which has been adjusted; and
an output control signal generation circuit which generates an output control signal of the output signal output through the second I/O cell based on the delay signal from the delay adjustment circuit.

11. An integrated circuit device, comprising:
a first I/O cell to which an input signal is input;
a second I/O cell from which an output signal is output;
the delay adjustment circuit as defined in claim 4 to which the input signal is input through the first I/O cell and which outputs the delay signal of the input signal, delay time of which has been adjusted; and
an output control signal generation circuit which generates an output control signal of the output signal output through the second I/O cell based on the delay signal from the delay adjustment circuit.

12. The integrated circuit device as defined in claim 8,
wherein the output control signal generation circuit generates an output enable signal of the second I/O cell based on the delay signal from the delay adjustment circuit.

13. A delay time adjustment method using the delay adjustment circuit as defined in claim 1, the method comprising:
inputting the test input signal having a pulse with a predetermined pulse width time to the delay circuit;
reading the comparison result data of the pulse width time of the test input signal and the M-th to N-th delay times from the comparison result register; and
setting adjustment data for adjusting the delay time of the delay signal based on the read comparison result data.

14. A delay time adjustment method using the delay adjustment circuit as defined in claim 2, the method comprising:
inputting the test input signal having a pulse with a predetermined pulse width time to the delay circuit;
reading the comparison result data of the pulse width time of the test input signal and the M-th to N-th delay times from the comparison result register; and
setting adjustment data for adjusting the delay time of the delay signal based on the read comparison result data.

15. A delay time adjustment method using the delay adjustment circuit as defined in claim 3, the method comprising:
inputting the test input signal having a pulse with a predetermined pulse width time to the delay circuit;
reading the comparison result data of the pulse width time of the test input signal and the M-th to N-th delay times from the comparison result register; and
setting adjustment data for adjusting the delay time of the delay signal based on the read comparison result data.

16. A delay time adjustment method using the delay adjustment circuit as defined in claim 4, the method comprising:

inputting the test input signal having a pulse with a predetermined pulse width time to the delay circuit;

reading the comparison result data of the pulse width time of the test input signal and the M-th to N-th delay times from the comparison result register; and setting adjustment data for adjusting the delay time of the delay signal based on the read comparison result data.

17. The delay time adjustment method as defined in claim 13, comprising:

inputting again the test input signal having a pulse with the predetermined pulse width time to the delay circuit after the delay time has been adjusted by setting the adjustment data; and confirming the delay time after adjustment by reading the comparison result data of the pulse width time of the test input signal input again and the M-th to N-th delay times from the comparison result register.

* * * * *